(12) United States Patent
Lee et al.

(10) Patent No.: US 9,406,656 B2
(45) Date of Patent: Aug. 2, 2016

(54) DISPLAY DEVICE USING SEMICONDUCTOR LIGHT EMITTING DEVICE AND METHOD OF FABRICATING THE SAME

(71) Applicant: LG ELECTRONICS INC., Seoul (KR)

(72) Inventors: Eunah Lee, Seoul (KR); Mingu Kang, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 0 days.

(21) Appl. No.: 14/693,633

(22) Filed: Apr. 22, 2015

(65) Prior Publication Data

US 2016/0126224 A1    May 5, 2016

(30) Foreign Application Priority Data

Oct. 29, 2014    (KR) .......................... 10-2014-0148504

(51) Int. Cl.
*H01L 25/075* (2006.01)
*H01L 25/00* (2006.01)
*H01L 33/38* (2010.01)
*H01L 33/00* (2010.01)

(52) U.S. Cl.
CPC ............ *H01L 25/0753* (2013.01); *H01L 25/50* (2013.01); *H01L 33/005* (2013.01); *H01L 33/38* (2013.01)

(58) Field of Classification Search
None
See application file for complete search history.

(56) References Cited

U.S. PATENT DOCUMENTS

| 2013/0256735 | A1 | 10/2013 | Kim |
| 2015/0221619 | A1 | 8/2015 | Rhee |
| 2015/0236214 | A1* | 8/2015 | Tischler ............... H01L 23/5387 257/98 |
| 2015/0295154 | A1* | 10/2015 | Tu ........................ H01L 33/0079 438/27 |

FOREIGN PATENT DOCUMENTS

| JP | 2008-103256 A | 5/2008 |
| KR | 10-2009-0122833 A | 12/2009 |
| KR | 20090122833 A * | 12/2009 |
| KR | 10-2010-0056299 A | 5/2010 |
| KR | 10-2013-0111800 A | 10/2013 |
| KR | 10-2014-0025055 A | 3/2014 |
| WO | WO 2014/030830 A1 | 2/2014 |

OTHER PUBLICATIONS

Machine translation of KR 20090122833 A.*
(Continued)

*Primary Examiner* — Joseph Schoenholtz
(74) *Attorney, Agent, or Firm* — Birch, Stewart, Kolasch & Birch, LLP

(57) ABSTRACT

A display device includes a first electrode; a second electrode; and a plurality of semiconductor light emitting devices coupled to a conductive adhesive layer, and electrically connected to the first electrode and the second electrode, wherein at least one of the plurality of semiconductor light emitting devices includes: a first conductive electrode and a second conductive electrode spaced from each other; a protruding unit extending from the second conductive electrode, and protruding from a side surface of at least one of the plurality of semiconductor light emitting devices; and a protection unit configured to cover at least part of the protruding unit for protection of the protruding unit.

18 Claims, 17 Drawing Sheets

(56) References Cited

OTHER PUBLICATIONS

Jeong, Chang Kyu, Kwi-ll Park, Jung Hwan Son, Geon-Tae Hwang, Seung Hyun Lee, Dae Yong Park, Han Eol Lee, Hwan Keon Lee, Myunghwan Byun, and Keon Jae Lee. "Self-powered Fully-flexible Light-emitting System Enabled by Flexible Energy Harvester." Energy Environ. Sci. 7.12 (2014): 4035-043.*

\* cited by examiner

DISPLAY DEVICE USING SEMICONDUCTOR LIGHT EMITTING DEVICE AND METHOD OF FABRICATING THE SAME

CROSS-REFERENCE TO RELATED APPLICATION

Pursuant to 35 U.S.C. §119(a), this application claims the benefit of earlier filing date and right of priority to Korean Application No. 10-2014-0148504, filed on Oct. 29, 2014, the contents of which is incorporated by reference herein in its entirety.

BACKGROUND OF THE INVENTION

1. Field of the Invention

Embodiments of the invention relate to a display device, and more particularly, to a display device using a semiconductor light emitting device.

2. Description of the Related Art

In recent years, display devices having excellent characteristics such as low profile, flexibility and the like have been developed in the display technical field. On the contrary, currently commercialized main displays are represented by liquid crystal displays (LCDs) and active matrix organic light emitting diodes (AMOLEDs).

However, there exist problems such as mediocre response time, difficult implementation of flexibility in the instance of LCDs, and there exist drawbacks such as short life span, mediocre yield as well as low flexibility in the instance of AMOLEDs.

On the other hand, light emitting diodes (LEDs) are well known light emitting devices for converting an electrical current to light, and have been used as a light source for displaying an image in an electronic device including information communication devices since red LEDs using GaAsP compound semiconductors were made commercially available in 1962, together with a GaP:N-based green LEDs. Accordingly, the semiconductor light emitting devices may be used to implement a flexible display, thereby presenting a scheme for solving the problems.

In this instance, the semiconductor light emitting devices used in a flexible display require a small size as a resolution increases. However, such a small size may cause horizontal type semiconductor light emitting devices to be applied to a flexible display with a difficulty, due to limitations of equipment and a resolution. Further, such a small sized device may reduce a width of each wire for current injection, and may reduce an interval between the wires. Therefore, a flexible display with a new structure, where an interval between wires is narrow even by horizontal type semiconductor light emitting devices, can be considered.

SUMMARY OF THE INVENTION

Therefore, an aspect of the embodiment of the invention is to provide a display device capable of being easily fabricated to have a fine pitch, even when a horizontal type semiconductor light emitting device is used.

Another aspect of the embodiment of the invention is to provide a display device capable of protecting a conductive electrode during fabrication processes.

Another aspect of the embodiment of the invention is to provide a display device capable of providing a flip chip type semiconductor light emitting device having a new structure.

To achieve these and other advantages and in accordance with the purpose of this specification, as embodied and broadly described herein, there is provided a display device, including: a first electrode; a second electrode; and a plurality of semiconductor light emitting devices coupled to a conductive adhesive layer, and electrically connected to the first electrode and the second electrode. At least one of the plurality of semiconductor light emitting devices may include a first conductive electrode and a second conductive electrode spaced from each other; a protruding unit extending from the second conductive electrode, and protruding from a side surface of at least one of the plurality of semiconductor light emitting devices; and a protection unit configured to cover at least part of the protruding unit for protection of the protruding unit.

In an embodiment of the invention, the protection unit may be formed of a conductive material electrically connected to the protruding unit. The first electrode may be electrically connected to the first conductive electrode, and the second electrode may be electrically connected to the protection unit. The protection unit may be provided with an upper surface farthest from the first conductive electrode, and the second electrode may be electrically connected to the upper surface.

In an embodiment of the invention, part of the protection unit facing the protruding unit may be formed to completely cover a part of the protruding unit facing the protection unit.

In an embodiment of the invention, the protection unit may be formed of a material capable of absorbing laser beams so as to protect the protruding unit from the laser beams. The protection unit may be formed of at least one of ZnO, $SnO_2$, Al-doped ZnO (AZO), Titanium Dioxide ($TiO_2$) and Ga-doped ZnO (GZO), and have a band gap smaller than that of the laser beams.

In an embodiment of the invention, at least one of the plurality of semiconductor light emitting devices may include a first conductive semiconductor layer, a second conductive semiconductor layer, and an active layer which are laminated in order, and the protection unit may extend from one surface to a side surface of the second conductive semiconductor layer.

The second conductive electrode may be disposed on the one surface, and the second conductive electrode may extend such that at least part thereof overlaps the protection unit.

An undoped semiconductor layer may be formed on another surface of the second conductive semiconductor layer. An upper surface of the protection unit, farthest from the first conductive electrode, may be formed on the same plane as an upper surface of the undoped semiconductor layer farthest from the first conductive electrode.

The first electrode may be disposed on a wiring substrate, and at least part of the plurality of semiconductor light emitting devices may be coupled to the conductive adhesive layer disposed between the wiring substrate and the second electrode. The one surface of the second conductive semiconductor layer may be a surface closest to the wiring substrate.

In an embodiment of the invention, the first conductive electrode and the second conductive electrode may be spaced from each other along a protruding direction of the protruding unit, and may be formed to have a height difference therebetween in a direction perpendicular to the protruding direction. The plurality of semiconductor light emitting devices may be implemented as flip chip type semiconductor light emitting devices.

In an embodiment of the invention, each of the plurality of semiconductor light emitting devices may be configured to emit at least one of red light, green light, blue light and ultraviolet light.

In an embodiment of the invention, the display device may further include a phosphor configured to convert light emitted from at least one of the plurality of semiconductor light emitting devices, into at least one of red light, green light and blue light.

To achieve these and other advantages and in accordance with the purpose of this specification, as embodied and broadly described herein, there is also provided a method of fabricating a display device, the method including: sequentially growing a first conductive semiconductor layer, an active layer, and a second conductive semiconductor layer, on a substrate; removing at least part of the first conductive semiconductor layer and the active layer, such that at least a part of the second conductive semiconductor layer is exposed; forming a first conductive electrode on the first conductive semiconductor layer, and forming a second conductive electrode at the exposed part of the second conductive semiconductor layer, for implementation of a flip chip type semiconductor light emitting device; and separating the substrate and the flip chip type semiconductor light emitting device from each other using laser beams, wherein the second conductive electrode may be provided with a protruding unit protruding from a side surface of the flip chip type semiconductor light emitting device, and wherein a protection unit is formed to cover at least a part of the protruding unit, such that the protruding unit is protected from the laser beams.

In an embodiment of the invention, in the forming of a second conductive electrode, the protection unit may be formed at the exposed part of the second conductive semiconductor layer, and the second conductive electrode may be formed at the protection unit. The protection unit may be formed of a conductive material electrically connected to the protruding unit.

To achieve these and other advantages and in accordance with the purpose of this specification, as embodied and broadly described herein, there is still also provided a flip chip type semiconductor light emitting device, including: a first conductive semiconductor layer; a second conductive semiconductor layer; and an active layer, wherein a first conductive electrode is formed on one surface of the first conductive semiconductor layer, the active layer is formed between another surface of the first conductive semiconductor layer and one surface of the second conductive semiconductor layer, and a second conductive electrode is formed at the second conductive semiconductor layer, wherein the second conductive electrode is provided with a protruding unit protruding from a side surface of the second conductive semiconductor layer, and wherein a protection unit formed of a conductive material is formed to cover the protruding unit.

The embodiments of the invention can have the following advantages.

Firstly, the display device can have a rollable characteristic, since the semiconductor light emitting device is arranged to have a fine pitch, and since the conductive adhesive layer has flexibility.

Secondly, the display device can be fabricated without an etching process, or a vacuum process for ohmic contact, through a flip chip type semiconductor light emitting device with a new structure.

Thirdly, since the protection unit is disposed between the conductive electrode and the substrate, damage of the conductive electrode due to laser beams used to remove the substrate, can be prevented.

Further scope of applicability of the embodiments of the invention will become more apparent from the embodiments of the invention given hereinafter. However, it should be understood that the embodiments of the invention and specific examples, while indicating preferred embodiments of the invention, are given by way of illustration only, since various changes and modifications within the spirit and scope of the invention will become apparent to those skilled in the art from the embodiment of the invention.

BRIEF DESCRIPTION OF THE DRAWINGS

The accompanying drawings, which are included to provide a further understanding of the invention and are incorporated in and constitute a part of this specification, illustrate exemplary embodiments and together with the description serve to explain the principles of the invention.

In the drawings.

DETAILED DESCRIPTION OF THE EMBODIMENTS

Figure 1:
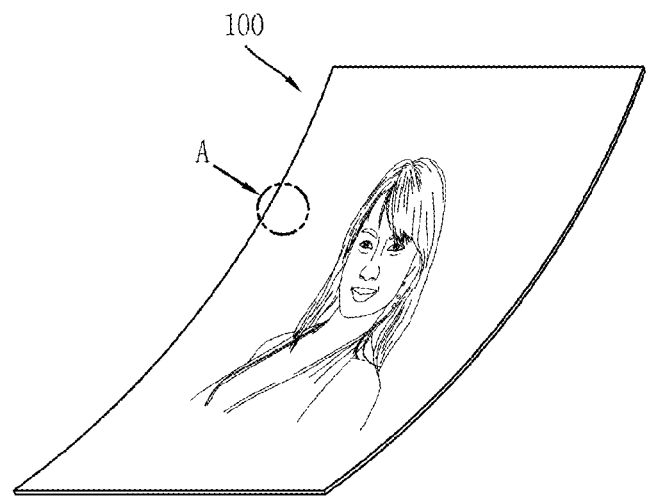
FIG. 1 is a conceptual view illustrating a display device using a semiconductor light emitting device according to an embodiment of the invention.

Hereinafter, the embodiments disclosed herein will be described in detail with reference to the accompanying drawings, and the same or similar elements are designated with the same numeral references regardless of the numerals in the drawings and their redundant description will be omitted. A suffix "module" or "unit" used for constituent elements disclosed in the following description is merely intended for ease of description of the specification, and the suffix itself does not give any special meaning or function. In describing the embodiments disclosed herein, moreover, the embodiment of the invention will be omitted when a specific description for publicly known technologies to which the invention pertains is judged to obscure the gist of the embodiments of invention. Also, it should be noted that the accompanying drawings are merely illustrated for ease of explaining the concept of the invention, and therefore, they should not be construed to limit the technological concept disclosed herein by the accompanying drawings.

Furthermore, it will be understood that when an element such as a layer, region or substrate is referred to as being "on" another element, it can be directly on the another element or an intermediate element may also be interposed therebetween.

A display device disclosed herein may include a portable phone, a smart phone, a laptop computer, a digital broadcast terminal, a personal digital assistant (PDA), a portable multimedia player (PMP), a navigation, a slate PC, a tablet PC, an ultrabook, a digital TV, a desktop computer, and the like. However, it would be easily understood by those skilled in the art that a configuration disclosed herein may be applicable to any displayable device even though it is a new product type which will be developed later.

FIG. 1 is a conceptual view illustrating a display device using a semiconductor light emitting device according to an embodiment of the invention.

According to the drawing, information processed in the controller of the display device 100 may be displayed using a flexible display.

The flexible display may include a flexible, bendable, twistable, foldable and rollable display. For example, the flexible display may be a display fabricated on a thin and flexible substrate that can be warped, bent, folded or rolled like a paper sheet while maintaining the display characteristics of a flat display of the related art.

A display area of the flexible display becomes a plane in a configuration that the flexible display is not warped (for example, a configuration having an infinite radius of curvature, hereinafter, referred to as a "first configuration"). The display area thereof becomes a curved surface in a configuration that the flexible display is warped by an external force in the first configuration (for example, a configuration having a finite radius of curvature, hereinafter, referred to as a "second configuration"). As illustrated in the drawing, information displayed in the second configuration may be visual information displayed on a curved surface. The visual information may be implemented by individually controlling the light emission of sub-pixels disposed in a matrix form. The sub-pixel denotes a minimum unit for implementing one color.

The sub-pixel of the flexible display may be implemented by a semiconductor light emitting device. According to the embodiment of the invention, a light emitting diode (LED) is illustrated as a type of semiconductor light emitting device. The light emitting diode may be formed with a small size to perform the role of a sub-pixel even in the second configuration through this.

Hereinafter, a flexible display implemented using the light emitting diode will be described in more detail with reference to the accompanying drawings.

Figure 2:
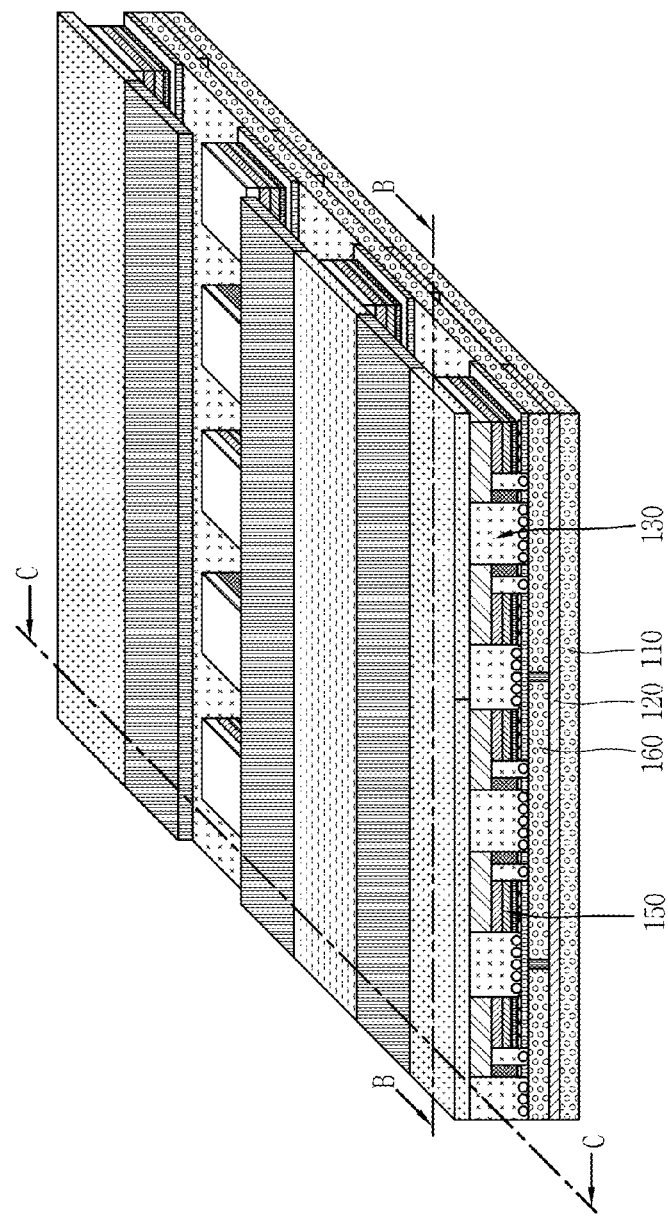
FIG. 2 is a partial enlarged view of portion "A" in FIG. 1, and FIGS. 3A and 3B are cross-sectional views taken along lines B-B and C-C in FIG. 2.
Figure 3A:
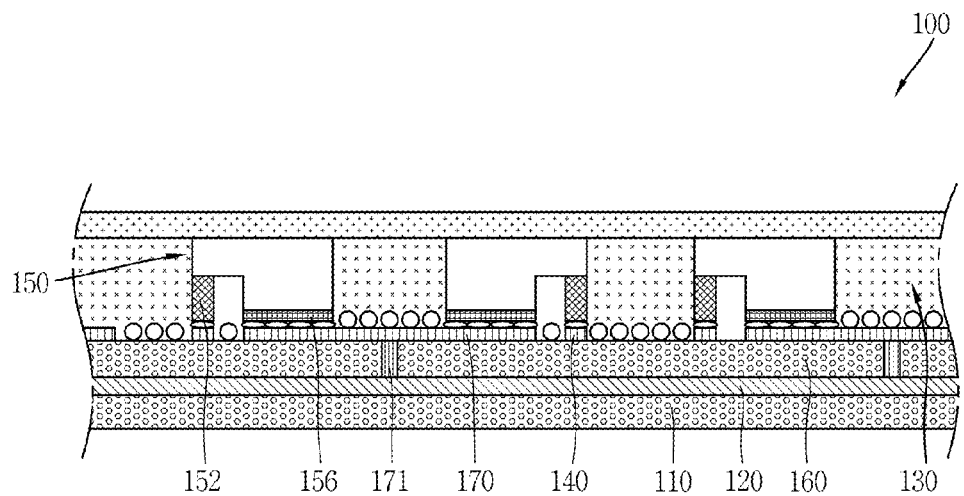
Figure 3B:
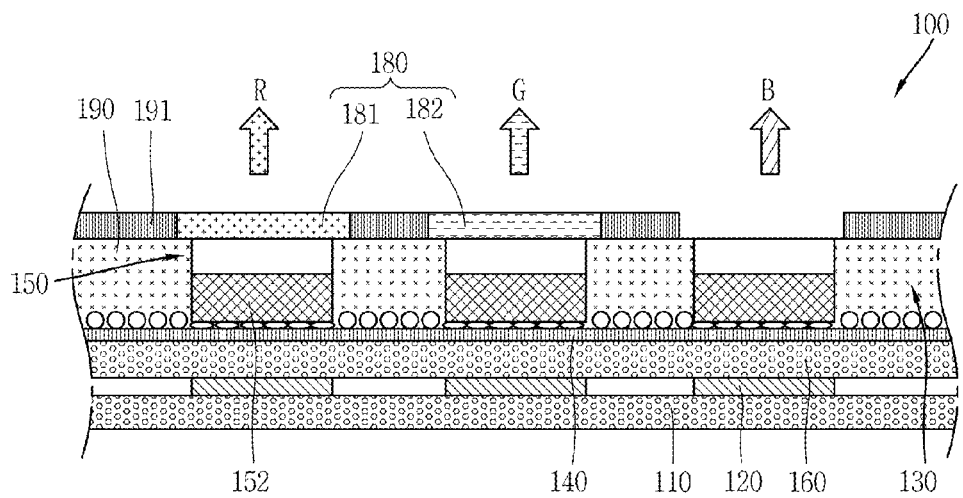
Figure 4:
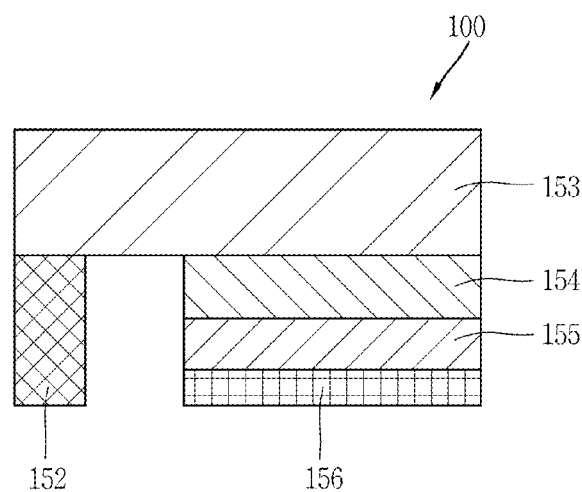
FIG. 4 is a conceptual view illustrating a flip-chip type semiconductor light emitting device in FIG. 3A.

FIG. 2 is a partial enlarged view of portion "A" in FIG. 1, and FIGS. 3A and 3B are cross-sectional views taken along lines B-B and C-C in FIG. 2, FIG. 4 is a conceptual view illustrating a flip-chip type semiconductor light emitting device in FIG. 3A, and FIGS. 5A through 5C are conceptual views illustrating various forms for implementing colors in connection with a flip-chip type semiconductor light emitting device.

As shown in FIGS. 2, 3A and 3B, there is illustrated a display device 100 using a passive matrix (PM) type semiconductor light emitting device as a display device 100 using a semiconductor light emitting device by way of example. However, the following illustration may be also applicable to an active matrix (AM) type semiconductor light emitting device in other embodiments.

The display device 100 may include a substrate 110, a first electrode 120, a conductive adhesive layer 130, a second electrode 140, and a plurality of semiconductor light emitting devices 150.

The substrate 110 may be a flexible substrate. The substrate 110 may contain glass or polyimide (PI) to implement the flexible display device. In addition, as a flexible material, any one such as polyethylene naphthalate (PEN), polyethylene terephthalate (PET) or the like may be used. Furthermore, the substrate 110 may be either one of transparent and non-transparent materials.

The substrate 110 may be a wiring substrate disposed with the first electrode 120, and thus the first electrode 120 may be placed on the substrate 110.

According to the drawing, an insulating layer 160 may be disposed on the substrate 110 placed with the first electrode 120, and an auxiliary electrode 170 may be placed on the insulating layer 160. In this instance, a configuration in which the insulating layer 160 is deposited on the substrate 110 may be a single wiring substrate. More specifically, the insulating layer 160 may be incorporated into the substrate 110 with an insulating and flexible material such as polyimide (PI), PET, PEN or the like to form a single wiring substrate.

The auxiliary electrode 170 as an electrode for electrically connecting the first electrode 120 to the semiconductor light emitting device 150 is placed on the insulating layer 160, and disposed to correspond to the location of the first electrode 120. For example, the auxiliary electrode 170 has a dot shape, and may be electrically connected to the first electrode 120 by means of an electrode hole 171 passing through the insulating layer 160. The electrode hole 171 may be formed by filling a conductive material in a via hole.

Referring to the drawings, the conductive adhesive layer 130 may be formed on one surface of the insulating layer 160, but the embodiments of the invention may not be necessarily limited to this. For example, it may be possible to also have a structure in which a layer performing a specific function is formed between the insulating layer 160 and the conductive adhesive layer 130, or the conductive adhesive layer 130 is disposed on the substrate 110 with no insulating layer 160. The conductive adhesive layer 130 may perform the role of an insulating layer in the structure in which the conductive adhesive layer 130 is disposed on the substrate 110.

The conductive adhesive layer 130 may be a layer having adhesiveness and conductivity, and to this end, a conductive material and an adhesive material may be mixed on the conductive adhesive layer 130. Furthermore, the conductive adhesive layer 130 may have flexibility, thereby allowing a flexible function in the display device.

For such an example, the conductive adhesive layer 130 may be an anisotropic conductive film (ACF), an anisotropic conductive paste, a solution containing conductive particles, and the like. The conductive adhesive layer 130 may allow electrical interconnection in the z-direction passing through the thickness thereof, but may be configured as a layer having electrical insulation in the horizontal x-y direction thereof. Accordingly, the conductive adhesive layer 130 may be referred to as a z-axis conductive layer (however, hereinafter referred to as a "conductive adhesive layer").

The anisotropic conductive film is a film with a form in which an anisotropic conductive medium is mixed with an insulating base member, and thus when heat and pressure are applied thereto, only a specific portion thereof may have conductivity by means of the anisotropic conductive medium. Hereinafter, heat and pressure are applied to the anisotropic conductive film, but other methods may be also available for the anisotropic conductive film to partially have conductivity. The methods may include applying only either one of heat and pressure thereto, UV curing, and the like.

Furthermore, the anisotropic conductive medium may be conductive balls or particles. According to the drawing, in the embodiment of the invention, the anisotropic conductive film is a film with a form in which an anisotropic conductive medium is mixed with an insulating base member, and thus when heat and pressure are applied thereto, only a specific portion thereof may have conductivity by means of the conductive balls. The anisotropic conductive film may be in a state in which a core with a conductive material contains a plurality of particles coated by an insulating layer with a polymer material, and in this instance, it may have conductivity by means of the core while breaking an insulating layer on a portion to which heat and pressure are applied. In this instance, a core may be transformed to implement a layer having both surfaces to which objects contact in the thickness direction of the film.

For a more specific example, heat and pressure are applied to an anisotropic conductive film as a whole, and electrical connection in the z-axis direction is partially formed by a height difference from an attached object adhered by the use of the anisotropic conductive film.

For another example, an anisotropic conductive film may be in a state containing a plurality of particles in which a conductive material is coated on insulating cores. In this instance, a portion to which heat and pressure are applied may be converted (pressed and adhered) to a conductive material to have conductivity in the thickness direction of the film. For still another example, it may be formed to have conductivity in the thickness direction of the film in which a conductive material passes through an insulating base member in the z-direction. In this instance, the conductive material may have a pointed end portion.

According to the drawing, the anisotropic conductive film may be a fixed array anisotropic conductive film (ACF) configured with a form in which conductive balls are inserted into one surface of the insulating base member. More specifically, the insulating base member is formed of an adhesive material, and the conductive balls are intensively disposed at a bottom portion of the Insulating base member, and when heat and pressure are applied thereto, the base member is modified along with the conductive balls, thereby having conductivity in the vertical direction thereof.

However, the embodiments of the invention may not be necessarily limited to this, and the anisotropic conductive film may be all allowed to have a form in which conductive balls are randomly mixed with an insulating base member or a form configured with a plurality of layers in which conductive balls are disposed at any one layer (double-ACF), and the like.

The anisotropic conductive paste as a form coupled to a paste and conductive balls may be a paste in which conductive balls are mixed with an insulating and adhesive base material. Furthermore, a solution containing conductive particles may be a solution in a form containing conductive particles or nano particles.

Referring to the drawing again, the second electrode 140 is located at the insulating layer 160 to be separated from the auxiliary electrode 170. In other words, the conductive adhesive layer 130 is disposed on the insulating layer 160 located with the auxiliary electrode 170 and the second electrode 140.

When the conductive adhesive layer 130 is formed in a state that the auxiliary electrode 170 and the second electrode 140 are located, and then the semiconductor light emitting device 150 is connected thereto in a flip chip form with the application of heat and pressure, the semiconductor light emitting device 150 is electrically connected to the first electrode 120 and the second electrode 140.

Referring to FIG. 4, the semiconductor light emitting device may be a flip chip type semiconductor light emitting device.

For example, the semiconductor light emitting device may include a p-type electrode 156, a p-type semiconductor layer 155 formed with the p-type electrode 156, an active layer 154 formed on the p-type semiconductor layer 155, an n-type semiconductor layer 153 formed on the active layer 154, and an n-type electrode 152 disposed to be separated from the p-type electrode 156 in the horizontal direction on the n-type semiconductor layer 153. In this instance, the p-type electrode 156 may be electrically connected to a welding portion by the conductive adhesive layer 130, and the n-type electrode 152 may be electrically connected to the second electrode 140.

Referring to FIGS. 2, 3A and 3B again, the auxiliary electrode 170 may be formed in an elongated manner in one direction to be electrically connected to a plurality of semiconductor light emitting devices 150. For example, the left and right p-type electrodes of the semiconductor light emitting devices around the auxiliary electrode 170 may be electrically connected to one auxiliary electrode 170.

More specifically, the semiconductor light emitting device 150 is pressed into the conductive adhesive layer 130, and through this, only a portion between the p-type electrode 156 and auxiliary electrode 170 of the semiconductor light emitting device 150 and a portion between the n-type electrode 152 and the second electrode 140 of the semiconductor light emitting device 150 have conductivity, and the remaining portion does not have conductivity since there is no push-down of the semiconductor light emitting device 150.

Furthermore, a plurality of semiconductor light emitting devices 150 constitute a light-emitting array, and a phosphor layer 180 is formed on the light-emitting array.

The light emitting device may include a plurality of semiconductor light emitting devices with different self luminance values. Each of the semiconductor light emitting devices 150 constitutes a sub-pixel, and is electrically connected to the first electrode 120. For example, there may exist a plurality of first electrodes 120, and the semiconductor light emitting devices are arranged in several rows, for instance, and each row of the semiconductor light emitting devices 150 may be electrically connected to any one of the plurality of first electrodes 120.

Furthermore, the semiconductor light emitting devices may be connected in a flip chip form, and thus semiconductor light emitting devices may be grown on a transparent dielectric substrate. Furthermore, the semiconductor light emitting devices may be nitride semiconductor light emitting devices, for instance. The semiconductor light emitting device 150 has an excellent luminance characteristic, and thus it may be possible to configure individual sub-pixels even with a small size thereof.

According to the drawing, a partition wall 190 may be formed between the semiconductor light emitting devices 150. In this instance, the partition wall 190 may perform the role of dividing individual sub-pixels from one another, and be formed as an integral body with the conductive adhesive layer 130. For example, a base member of the anisotropic conductive film may form the partition wall 190 when the semiconductor light emitting device 150 is inserted into the anisotropic conductive film.

Furthermore, when the base member of the anisotropic conductive film is black, the partition wall 190 may have reflective characteristics while at the same time increasing contrast with no additional black insulator.

For another example, a reflective partition wall may be separately provided with the partition wall 190. In this instance, the partition wall 190 may include a black or white insulator according to the purpose of the display device. It may have an effect of enhancing reflectivity when the partition wall of the white insulator is used, and increase contrast while at the same time having reflective characteristics.

The phosphor layer 180 may be located at an outer surface of the semiconductor light emitting device 150. For example, in one embodiment of the invention, the semiconductor light emitting device 150 is a blue semiconductor light emitting device that emits blue (B) light, and the phosphor layer 180 performs the role of converting the blue (B) light into the color of a sub-pixel. The phosphor layer 180 may be a red phosphor layer 181 or a green phosphor layer 182 constituting individual pixels. The phosphor layer 180 may be other color phosphor layers.

In other words, a red phosphor 181 capable of converting blue light into red (R) light may be deposited on the blue semiconductor light emitting device at a location implementing a red sub-pixel, and a green phosphor 182 capable of converting blue light into green (G) light may be deposited on the blue semiconductor light emitting device at a location implementing a green sub-pixel. Furthermore, only the blue semiconductor light emitting device may be solely used at a location implementing a blue sub-pixel. In this instance, the red (R), green (G) and blue (B) sub-pixels may implement one pixel. More specifically, one color phosphor may be deposited along each line of the first electrode 120. Accordingly, one line on the first electrode 120 may be an electrode controlling one color. In other words, red (R), green (B) and blue (B) may be sequentially disposed, thereby implementing sub-pixels.

However, the embodiments of the invention may not be necessarily limited to this, and the semiconductor light emitting device 150 may be combined with a quantum dot (QD) instead of a phosphor to implement sub-pixels such as red (R), green (G) and blue (B).

Furthermore, a black matrix 191 may be disposed between each phosphor layer to enhance contrast. In other words, the black matrix 191 can enhance the contrast of luminance.

However, the embodiments of the invention may not be necessarily limited to this, and another structure for implementing sub-pixels of blue, red and green may be also applicable thereto.

Figure 5A:
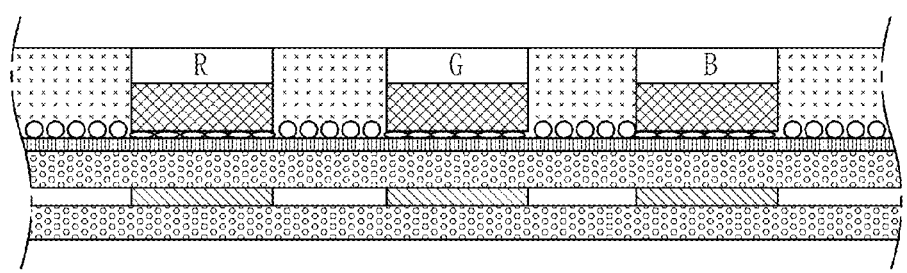
FIGS. 5A through 5C are conceptual views illustrating various forms for implementing colors in connection with a flip-chip type semiconductor light emitting device.

Referring to FIG. 5A, each of the semiconductor light emitting devices 150 may be implemented with a high-power light emitting device that emits various lights including blue in which gallium nitride (GaN) is mostly used, and indium (In) and or aluminum (Al) are added thereto.

In this instance, the semiconductor light emitting device 150 may be red, green and blue semiconductor light emitting devices, respectively, to implement each sub-pixel. For instance, red, green and blue semiconductor light emitting devices (R, G, B) are alternately disposed, and red, green and blue sub-pixels implement one pixel by means of the red, green and blue semiconductor light emitting devices, thereby implementing a full color display.

Figure 5B:
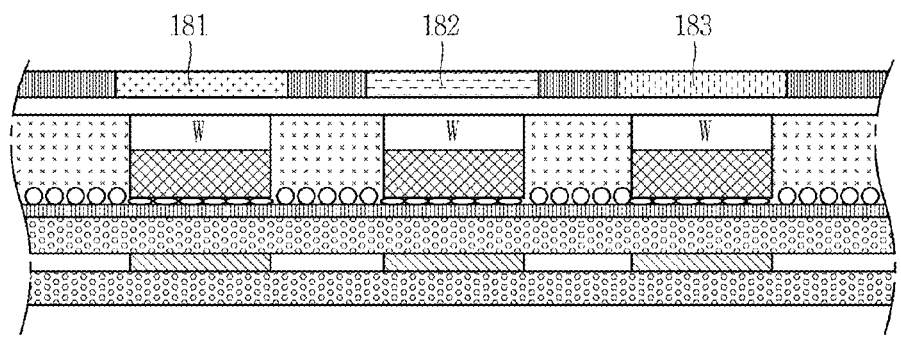

Referring to FIG. 5B, the semiconductor light emitting device may have a white light emitting device (W) provided with a yellow phosphor layer for each element. In this instance, a red phosphor layer 181, a green phosphor layer 182 and blue phosphor layer 183 may be provided on the white light emitting device (W) to implement a sub-pixel. Furthermore, a color filter repeated with red, green and blue on the white light emitting device (W) may be used to implement a sub-pixel.

Figure 5C:
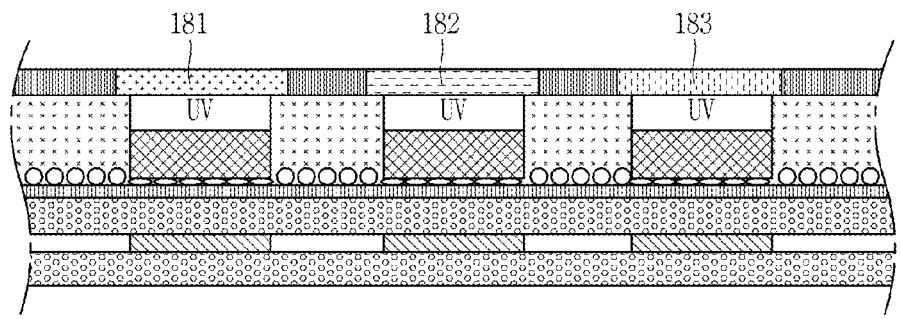

Referring to FIG. 5C, it may be possible to also have a structure in which a red phosphor layer 181, a green phosphor layer 182 and blue phosphor layer 183 may be provided on a ultra violet light emitting device (UV). In this manner, the semiconductor light emitting device can be used over the entire region up to ultra violet (UV) as well as visible light, and may be extended to a form of semiconductor light emitting device in which ultra violet (UV) can be used as an excitation source.

Taking the this example into consideration again, the semiconductor light emitting device 150 is placed on the conductive adhesive layer 130 to configure a sub-pixel in the display device. The semiconductor light emitting device 150 may have excellent luminance characteristics, and thus it may be possible to configure individual sub-pixels even with a small size thereof. The size of the individual semiconductor light emitting device 150 may be less than 80 μm in the length of one side thereof, and formed with a rectangular or square shaped element. In an instance of a rectangular shaped element, the size thereof may be less than 20×80 μm.

Furthermore, even when a square shaped semiconductor light emitting device 150 with a length of side of 10 μm is used for a sub-pixel, it will exhibit a sufficient brightness for implementing a display device. Accordingly, for example, in the instance of a rectangular pixel in which one side of a sub-pixel is 600 μm in size, and the remaining one side thereof is 300 μm, a relative distance between the semiconductor light emitting devices becomes sufficiently large. Accordingly, in this instance, it may be possible to implement a flexible display device having an HD image quality.

A display device using the foregoing semiconductor light emitting device will be fabricated by a new type of fabrication method. Hereinafter, the fabrication method will be described with reference to FIG. 6.

Figure 6:
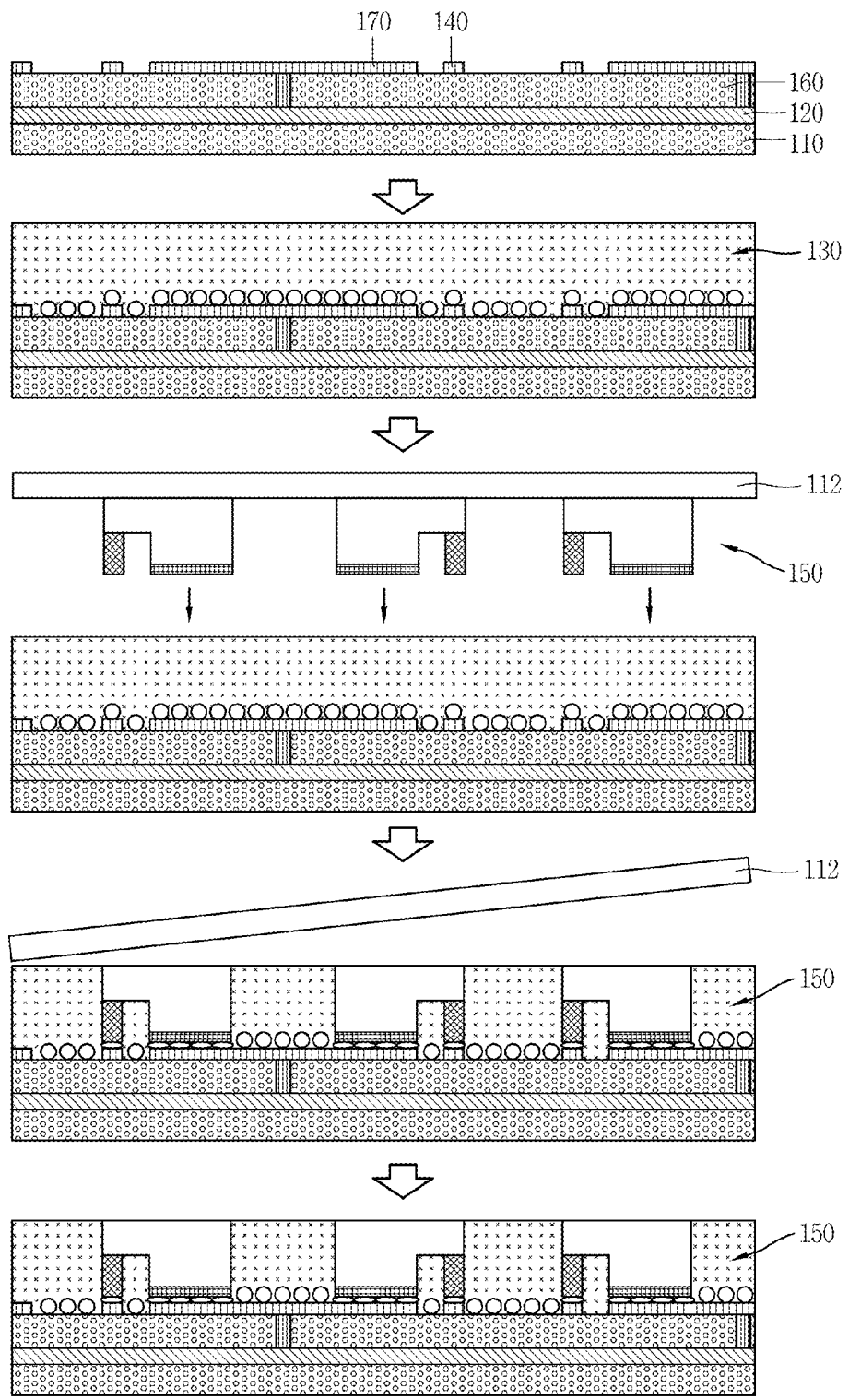
FIG. 6 provides cross-sectional views illustrating a method of fabricating a display device using a semiconductor light emitting device according to the invention.

FIG. 6 is cross-sectional views illustrating a method of fabricating a display device using a semiconductor light emitting device according to the embodiment of the invention.

Referring to the drawing, first, the conductive adhesive layer 130 is formed on the insulating layer 160 located with the auxiliary electrode 170 and the second electrode 140. The insulating layer 160 is deposited on the first substrate 110 to form one substrate (or wiring substrate), and the first electrode 120, auxiliary electrode 170 and the second electrode 140 are disposed at the wiring substrate. In this instance, the first electrode 120 and the second electrode 140 may be disposed in a perpendicular direction to each other. Furthermore, the first substrate 110 and insulating layer 160 may contain glass or polyimide (PI), respectively, to implement a flexible display device.

The conductive adhesive layer 130 may be implemented by an anisotropic conductive film, for example, and to this end, an anisotropic conductive film may be coated on a substrate located with the insulating layer 160.

Next, a second substrate 112 located with a plurality of semiconductor light emitting devices 150 corresponding to the location of the auxiliary electrodes 170 and the second electrodes 140 and constituting individual pixels is disposed such that the semiconductor light emitting device 150 faces the auxiliary electrode 170 and the second electrode 140.

In this instance, the second substrate 112 as a growth substrate for growing the semiconductor light emitting device 150 may be a sapphire substrate or a silicon substrate.

The semiconductor light emitting device may have a gap and size capable of implementing a display device when formed in the unit of a wafer, and thus effectively used for a display device.

Next, the wiring substrate is thermally compressed to the second substrate 112. For example, the wiring substrate and the second substrate 112 may be thermally compressed to each other by applying an ACF press head. The wiring substrate and the second substrate 112 are bonded to each other using the thermal compression. Only a portion between the semiconductor light emitting device 150 and the auxiliary electrode 170 and the second electrode 140 may have conductivity due to the characteristics of an anisotropic conductive film having conductivity by thermal compression, thereby allowing the electrodes and semiconductor light emitting device 150 to be electrically connected to each other. At this time, the semiconductor light emitting device 150 may be inserted into the anisotropic conductive film, thereby forming a partition wall between the semiconductor light emitting devices 150.

Next, the second substrate 112 is removed. For example, the second substrate 112 may be removed using a laser lift-off (LLO) or chemical lift-off (CLO) method.

Finally, the second substrate 112 is removed to expose the semiconductor light emitting devices 150 to the outside. Silicon oxide (SiOx) or the like may be coated on the wiring substrate coupled to the semiconductor light emitting device 150 to form a transparent insulating layer.

Furthermore, it may further include the process of forming a phosphor layer on one surface of the semiconductor light emitting device 150. For example, the semiconductor light emitting device 150 may be a blue semiconductor light emitting device for emitting blue (B) light, and red or green phosphor for converting the blue (B) light into the color of the sub-pixel may form a layer on one surface of the blue semiconductor light emitting device.

The fabrication method or structure of a display device using the foregoing semiconductor light emitting device may be modified in various forms. For such an example, the foregoing display device may be applicable to a vertical semiconductor light emitting device. Hereinafter, the vertical structure will be described with reference to FIGS. 5 and 6.

Furthermore, according to the following modified example or embodiment of the invention, the same or similar reference numerals are designated to the same or similar configurations to the foregoing example, and the description thereof will be substituted by the earlier description.

Figure 7:
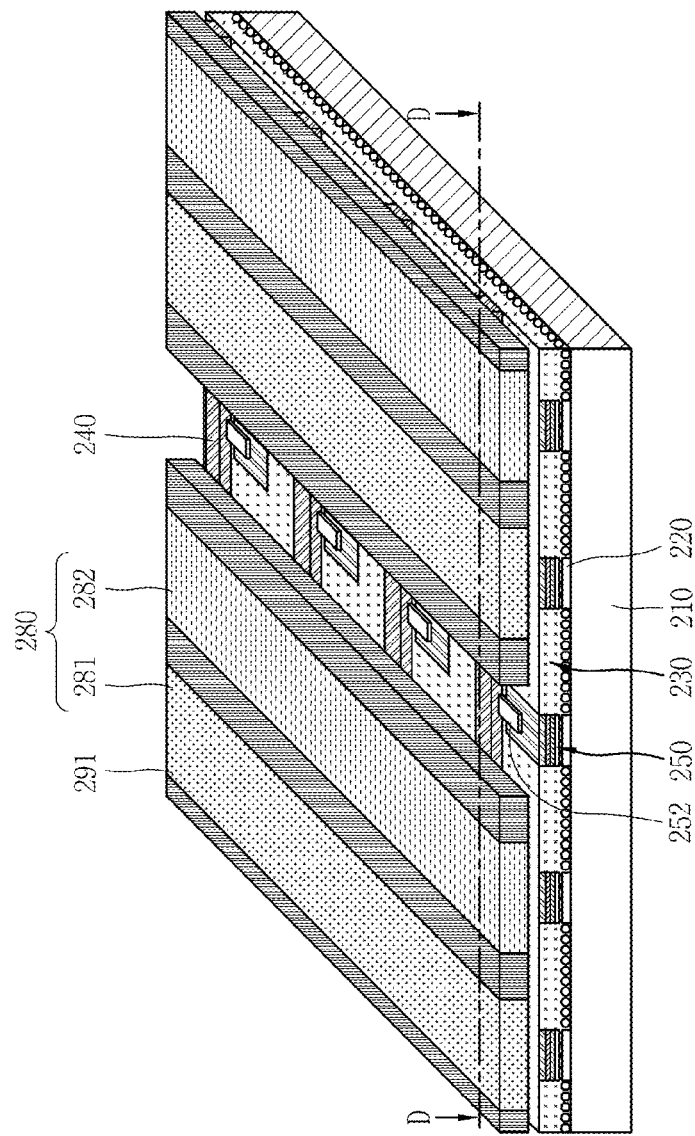
FIG. 7 is a perspective view illustrating a display device using a semiconductor light emitting device according to another embodiment of the invention.
Figure 8:
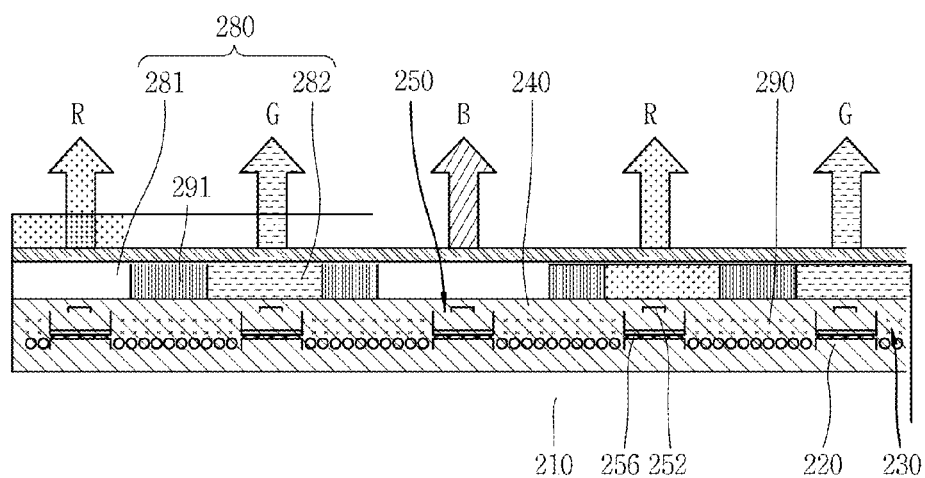
FIG. 8 is a cross-sectional view taken along line D-D in FIG. 7.
Figure 9:
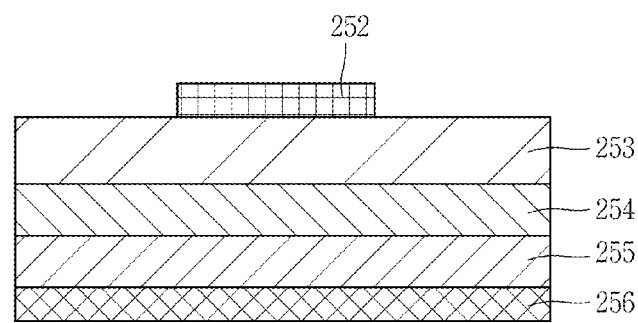
FIG. 9 is a conceptual view illustrating a vertical type semiconductor light emitting device in FIG. 8.

FIG. 7 is a perspective view illustrating a display device using a semiconductor light emitting device according to another embodiment of the invention. FIG. 8 is a cross-sectional view taken along line D-D in FIG. 7, and FIG. 9 is a conceptual view illustrating a vertical type semiconductor light emitting device in FIG. 8.

As shown in the drawings, the display device may be a display device using a passive matrix (PM) type of vertical semiconductor light emitting device, but in other embodiments, an active matrix (AP) type of vertical semiconductor light emitting device may be used.

The display device may include a substrate 210, a first electrode 220, a conductive adhesive layer 230, a second electrode 240 and a plurality of semiconductor light emitting devices 250.

The substrate 210 as a wiring substrate disposed with the first electrode 220 may include polyimide (PI) to implement a flexible display device. In addition, any material may be used if it is an insulating and flexible material.

The first electrode 220 may be located on the substrate 210, and formed with an electrode having a bar elongated in one direction. The first electrode 220 may be formed to perform the role of a data electrode.

The conductive adhesive layer 230 is formed on the substrate 210 located with the first electrode 220. Similarly to a display device to which a flip chip type light emitting device is applied, the conductive adhesive layer 230 may be an anisotropic conductive film (ACF), an anisotropic conductive paste, a solution containing conductive particles, and the like. However, the embodiment of the invention illustrates an instance where the conductive adhesive layer 230 is implemented by an anisotropic conductive film.

When an anisotropic conductive film is located in a state that the first electrode 220 is located on the substrate 210, and then heat and pressure are applied to connect the semiconductor light emitting device 250 thereto, the semiconductor light emitting device 250 is electrically connected to the first electrode 220. At this time, the semiconductor light emitting device 250 may be preferably disposed on the first electrode 220.

The electrical connection is generated because an anisotropic conductive film partially has conductivity in the thickness direction when heat and pressure are applied as described above. Accordingly, the anisotropic conductive film is partitioned into a portion having conductivity and a portion having no conductivity in the thickness direction thereof.

Furthermore, the anisotropic conductive film contains an adhesive component, and thus the conductive adhesive layer 230 implements a mechanical coupling as well as an electrical coupling between the semiconductor light emitting device 250 and the first electrode 220.

In this manner, the semiconductor light emitting device 250 is placed on the conductive adhesive layer 230, thereby configuring a separate sub-pixel in the display device. The semiconductor light emitting device 250 may have excellent luminance characteristics, and thus it may be possible to configure individual sub-pixels even with a small size thereof. The size of the individual semiconductor light emitting device 250 may be less than 80 μm in the length of one side thereof, and formed with a rectangular or square shaped element. In the instance of a rectangular shaped element, the size thereof may be less than 20×80 μm.

The semiconductor light emitting device 250 may be of a vertical structure.

A plurality of second electrodes 240 disposed in a direction crossed with the length direction of the first electrode 220, and electrically connected to the vertical semiconductor light emitting device 250 may be located between vertical semiconductor light emitting devices.

Referring to FIG. 9, the vertical semiconductor light emitting device may include a p-type electrode 256, a p-type semiconductor layer 255 formed with the p-type electrode 256, an active layer 254 formed on the p-type semiconductor layer 255, an n-type semiconductor layer 253 formed on the active layer 254, and an n-type electrode 252 formed on the n-type semiconductor layer 253. In this instance, the p-type electrode 256 located at the bottom thereof may be electrically connected to the first electrode 220 by the conductive adhesive layer 230, and the n-type electrode 252 located at the top thereof may be electrically connected to the second electrode 240 which will be described later. The electrodes may be disposed in the upward/downward direction in the vertical semiconductor light emitting device 250, thereby providing a great advantage capable of reducing the chip size.

Referring to FIG. 8 again, a phosphor layer 280 may be formed on one surface of the semiconductor light emitting device 250. For example, the semiconductor light emitting device 250 is a blue semiconductor light emitting device 251 that emits blue (B) light, and the phosphor layer 280 for converting the blue (B) light into the color of the sub-pixel may be provided thereon. In this instance, the phosphor layer 280 may be a red phosphor 281 and a green phosphor 282 constituting individual pixels.

In other words, a red phosphor 281 capable of converting blue light into red (R) light may be deposited on the blue semiconductor light emitting device 251 at a location implementing a red sub-pixel, and a green phosphor 282 capable of converting blue light into green (G) light may be deposited on the blue semiconductor light emitting device 251 at a location implementing a green sub-pixel. Furthermore, only the blue semiconductor light emitting device 251 may be solely used at a location implementing a blue sub-pixel. In this instance, the red (R), green (G) and blue (B) sub-pixels may implement one pixel.

However, the embodiments of the invention may not be necessarily limited to this, and another structure for implementing sub-pixels of blue, red and green may be also applicable thereto as described above in a display device to which a flip chip type light emitting device is applied.

Taking the embodiment of the invention into consideration again, the second electrode 240 is located between the semiconductor light emitting devices 250, and electrically connected to the semiconductor light emitting devices 250. For example, the semiconductor light emitting devices 250 may be disposed in a plurality of rows, and the second electrode 240 may be located between the rows of the semiconductor light emitting devices 250.

Since a distance between the semiconductor light emitting devices 250 constituting individual pixels is sufficiently large, the second electrode 240 may be located between the semiconductor light emitting devices 250.

The second electrode 240 may be formed with an electrode having a bar elongated in one direction, and disposed in a perpendicular direction to the first electrode.

Furthermore, the second electrode 240 may be electrically connected to the semiconductor light emitting device 250 by a connecting electrode protruded from the second electrode 240. More specifically, the connecting electrode may be an n-type electrode of the semiconductor light emitting device 250. For example, the n-type electrode is formed with an ohmic electrode for ohmic contact, and the second electrode covers at least part of the ohmic electrode by printing or deposition. Through this, the second electrode 240 may be electrically connected to the n-type electrode of the semiconductor light emitting device 250.

According to the drawing, the second electrode 240 may be located on the conductive adhesive layer 230. According to circumstances, a transparent insulating layer containing silicon oxide (SiOx) may be formed on the substrate 210 formed with the semiconductor light emitting device 250. When the transparent insulating layer is formed and then the second electrode 240 is placed thereon, the second electrode 240 may be located on the transparent insulating layer. Furthermore, the second electrode 240 may be formed to be separated from the conductive adhesive layer 230 or transparent insulating layer.

If a transparent electrode such as indium tin oxide (ITO) is used to locate the second electrode 240 on the semiconductor light emitting device 250, the ITO material has a problem of bad adhesiveness with an n-type semiconductor. Accordingly, the second electrode 240 may be placed between the semiconductor light emitting devices 250, thereby obtaining an advantage in which the transparent electrode is not required. Accordingly, an n-type semiconductor layer and a conductive material having a good adhesiveness may be used as a horizontal electrode without being restricted by the selection of a transparent material, thereby enhancing the light extraction efficiency.

According to the drawing, a partition wall 290 may be formed between the semiconductor light emitting devices 250. In other words, the partition wall 290 may be disposed between the vertical semiconductor light emitting devices 250 to isolate the semiconductor light emitting device 250 constituting individual pixels. In this instance, the partition wall 290 may perform the role of dividing individual sub-pixels from one another, and be formed as an integral body with the conductive adhesive layer 230. For example, a base member of the anisotropic conductive film may form the partition wall 290 when the semiconductor light emitting device 250 is inserted into the anisotropic conductive film.

Furthermore, when the base member of the anisotropic conductive film is black, the partition wall 290 may have reflective characteristics while at the same time increasing contrast with no additional black insulator.

For another example, a reflective partition wall may be separately provided with the partition wall 290. In this instance, the partition wall 290 may include a black or white insulator according to the purpose of the display device.

If the second electrode 240 is precisely located on the conductive adhesive layer 230 between the semiconductor light emitting devices 250, the partition wall 290 may be located between the semiconductor light emitting device 250 and the second electrode 240. Accordingly, individual sub-pixels may be configured even with a small size using the semiconductor light emitting device 250, and a distance between the semiconductor light emitting devices 250 may be relatively sufficiently large to place the second electrode 240 between the semiconductor light emitting devices 250, thereby having the effect of implementing a flexible display device having an HD image quality.

Furthermore, according to the drawing, a black matrix 291 may be disposed between each phosphor layer to enhance contrast. In other words, the black matrix 291 can enhance the contrast of luminance.

As described above, the semiconductor light emitting device 250 is located on the conductive adhesive layer 230, thereby constituting individual pixels on the display device. The semiconductor light emitting device 250 has excellent luminance characteristics, thereby configuring individual sub pixels even with a small size thereof. As a result, it may be possible to implement a full color display in which sub pixels of red (R), green (G) and blue (B) implement one pixel by means of the semiconductor light emitting device.

In a display device using a semiconductor light emitting device according to the embodiment of the invention as described above, it may be difficult to implement a fine pitch since a first electrode and a second electrode are arranged on the same plane when a flip chip type is applied to the display device, and it may have a problem in which an etching process and a vacuum process are accompanied therewith for electrode ohmic formation when a vertical type semiconductor light emitting device is applied to the display device. According to the embodiment of the invention, there is proposed a flip chip type semiconductor light emitting device with a new form to solve the foregoing problem. Hereinafter, a display device to which a flip chip type semiconductor light emitting device with a new form is applied will be described in more detail.

Figure 10:
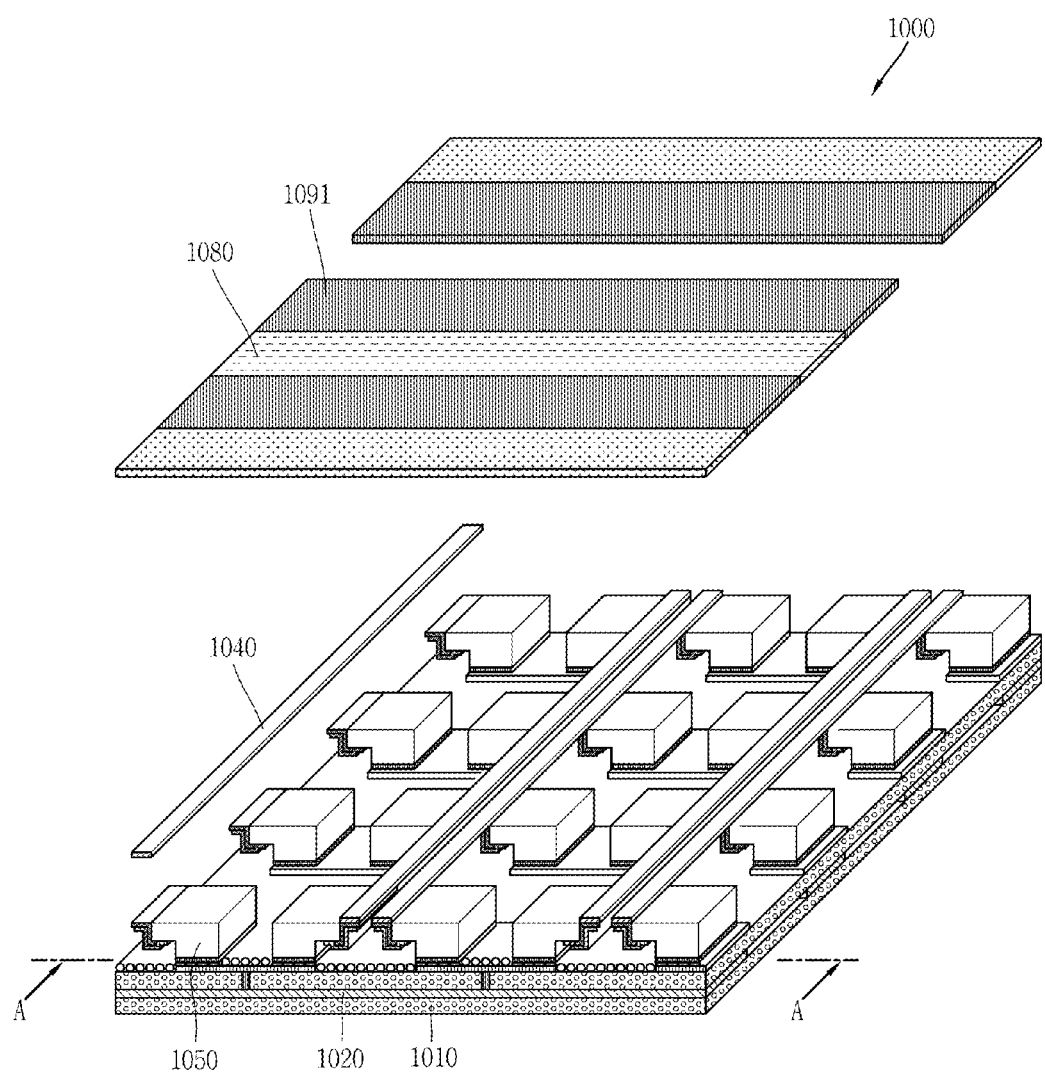
FIG. 10 is a partially enlarged view illustrating a display device to which a semiconductor light emitting device with a new structure is applied.
Figure 11A:
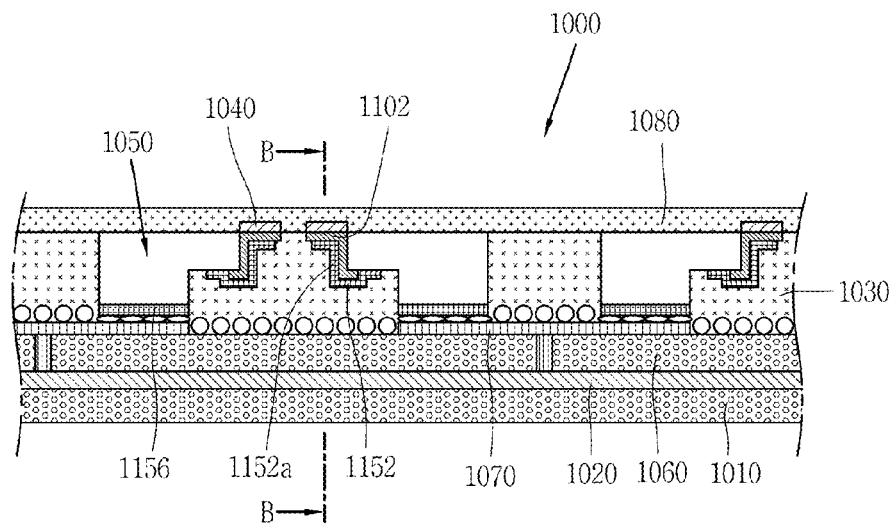
FIG. 11A is a cross-sectional view taken along line A-A in FIG. 10.
Figure 11B:
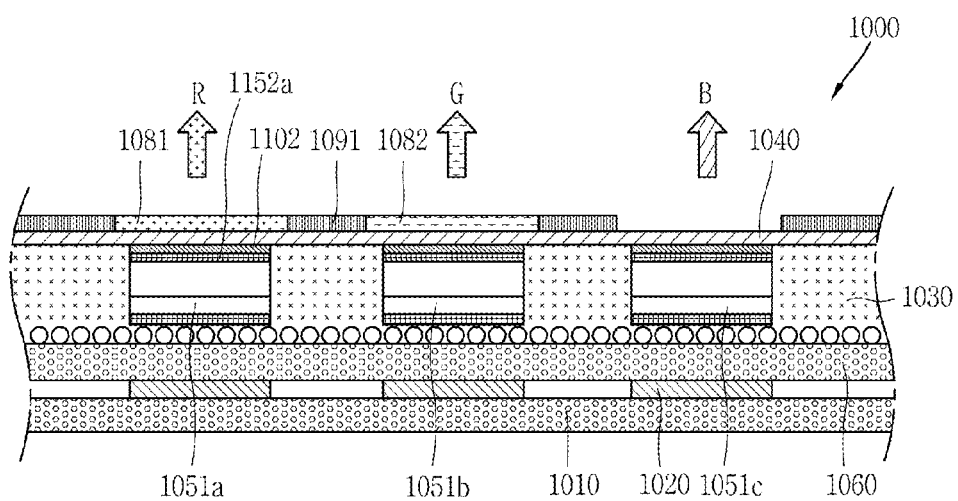
FIG. 11B is a cross-sectional view taken along line B-B in FIG. 11.
Figure 12:
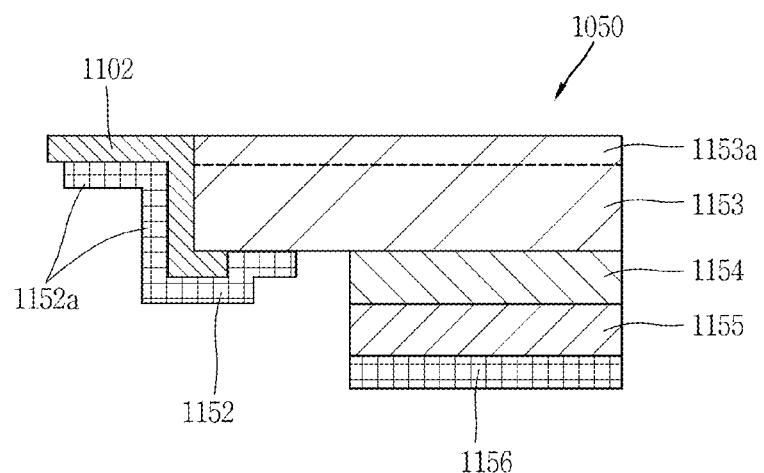
FIG. 12 is a conceptual view illustrating a flip chip type semiconductor light emitting device of FIG. 11A.

FIG. 10 is a partially enlarged view illustrating a display device to which a semiconductor light emitting device with a new structure is applied, and FIG. 11A is a cross-sectional view taken along line A-A in FIG. 10, and FIG. 11B is a cross-sectional view taken along line B-B in FIG. 11, and FIG. 12 is a conceptual view illustrating a flip chip type semiconductor light emitting device of FIG. 11A.

Referring to FIGS. 10, 11A and 11B, there is illustrated a display device 100 using a passive matrix (PM) type semiconductor light emitting device as a display device 1000 using a semiconductor light emitting device. However, the following illustration may be also applicable to an active matrix (AM) type semiconductor light emitting device.

The display device 1000 may include a substrate 1010, a first electrode 1020, a conductive adhesive layer 1030, a second electrode 1040, and a plurality of semiconductor light emitting devices 1050. In this instance, the first electrode 1020 and the second electrode 1040 may include a plurality of electrode lines, respectively.

The substrate 1010, a wiring substrate on which the first electrode 1020 is disposed, may include polyimide (PI) to implement a flexible display device. In addition, any material may be used if it is an insulating and flexible material.

The first electrode 1020 may be located on the substrate 1010, and formed as an electrode having a bar elongated in one direction. The first electrode 1020 may be formed to serve as a data electrode.

The conductive adhesive layer 1030 is formed on the substrate 1010 where the first electrode 1020 is positioned. Like a display device to which a flip chip type semiconductor light emitting device has been applied, the conductive adhesive layer 1030 may be an anisotropic conductive film (ACF), an anisotropic conductive paste, a solution containing conductive particles, and the like. However, the embodiment of the invention illustrates an instance where the conductive adhesive layer 1030 is implemented by an anisotropic conductive film.

When an anisotropic conductive film is disposed in a state where the first electrode 1020 is located on the substrate 1010, and then heat and pressure are applied to connect the semiconductor light emitting devices 1050 to the anisotropic conductive film, the semiconductor light emitting devices 1050 are electrically connected to the first electrode 1020. At this time, the semiconductor light emitting devices 1050 may be preferably disposed on the first electrode 1020.

The electrical connection is generated because an anisotropic conductive film partially has conductivity in a thickness direction when heat and pressure are applied as described above. Accordingly, the anisotropic conductive film is partitioned into a portion having conductivity and a portion having no conductivity in the thickness direction.

Furthermore, the anisotropic conductive film contains an adhesive component, and thus the conductive adhesive layer 1030 implements a mechanical coupling as well as an electrical coupling between the semiconductor light emitting device 1050 and the first electrode 1020.

A plurality of second electrodes 1040 disposed in a direction crossing a length direction of the first electrode 1020, and electrically connected to the semiconductor light emitting device 1050 may be located between the semiconductor light emitting devices.

According to the drawing, the second electrode 1040 may be located on the conductive adhesive layer 1030. In other words, the conductive adhesive layer 1030 is disposed between the wiring substrate and the second electrode 1040. The second electrode 1040 may be electrically connected to the semiconductor light emitting device 1050 in a contacting manner.

Under the aforementioned structure, the plurality of semiconductor light emitting devices 1050 are coupled to the conductive adhesive layer 1030, and electrically connected to the first electrode 1020 and the second electrode 1040.

In some instances, a transparent insulating layer containing silicon oxide (SiOx) may be formed on the substrate 1010 where the semiconductor light emitting devices 1050 have been formed. When the transparent insulating layer is formed and then the second electrode 1040 is placed, the second electrode 1040 may be located on the transparent insulating layer. Furthermore, the second electrode 1040 may be formed to be separated from the conductive adhesive layer 1030 or the transparent insulating layer.

As illustrated in the drawing, the plurality of semiconductor light emitting devices 1050 may form a plurality of columns in a direction parallel to a plurality of electrode lines provided at the first electrode 1020. However, the embodiment of the invention may not be necessarily limited to this. For example, the plurality of semiconductor light emitting devices 1050 may form a plurality of columns along the second electrode 1040.

Moreover, the display device 1000 may further include a phosphor layer 1080 formed on one surface of the plurality of semiconductor light emitting devices 1050. For example, the semiconductor light emitting device 1050 is a blue semiconductor light emitting device that emits blue (B) light, and the phosphor layer 1080 performs a function to convert the blue (B) light into a color of a sub pixel. The phosphor layer 1080 may be a red phosphor layer 1081 or green phosphor layer 1082 constituting individual pixels. In other words, a red phosphor layer 1081 capable of converting blue light into red (R) light may be deposited on the blue semiconductor light emitting device 1051a, at a location implementing a red sub pixel, and a green phosphor 1082 capable of converting blue light into green (G) light may be deposited on the blue semiconductor light emitting device 1051b, at a location implementing a green sub pixel. Furthermore, only the blue semiconductor light emitting device 1051c may be used at a location implementing a blue sub pixel. In this instance, the red (R), green (G) and blue (B) sub pixels may implement one pixel. More specifically, one color phosphor may be deposited along each line of the first electrode 1020. Accordingly, one line on the first electrode 1020 may be an electrode controlling one color. In other words, red (R), green (B) and blue (B) may be sequentially disposed along the second electrode 1040, thereby implementing sub pixels. However, the embodiment of the invention may not be necessarily limited to this, and the semiconductor light emitting device 1050 may be combined with a quantum dot (QD) instead of a phosphor to implement sub pixels such as red (R), green (G) and blue (B).

On the other hand, the display device may further include a black matrix 1091 disposed between each phosphor to enhance a contrast of the phosphor layer 1080. The black matrix 1091 may be formed in such a manner that a gap is made between phosphor dots, and a black material fills into the gap. Under such configuration, the black matrix 1091 may enhance a contrast between light and shade while absorbing reflected external light. The black matrix 1091 is located between each phosphor along the first electrode 1020, in a deposition direction of the phosphor layer 1080. In this instance, a phosphor layer is not formed at a location corresponding to the blue semiconductor light emitting device 1051c, but black matrices may be formed at both sides of the blue semiconductor light emitting device 1051c by interposing space not provided with the phosphor layer therebetween.

Referring to the semiconductor light emitting devices 1050 according to the embodiment of the invention again, electrodes are disposed in a vertical direction, thereby having an advantage of reducing a chip size. However, the semiconductor light emitting devices according to the embodiment of the invention may be flip chip type semiconductor light emitting devices, under the structure that electrodes are disposed in a vertical direction. In this instance, the structure of such a new semiconductor light emitting device will be described in detail.

Referring to FIG. 12, for example, the semiconductor light emitting device 1050 may include a first conductive electrode 1156, a first conductive semiconductor layer 1155 formed with the first conductive electrode 1156, an active layer 1154 formed on the first conductive semiconductor layer 1155, a second conductive semiconductor layer 1153 formed on the active layer 1154, and a second conductive electrode 1152 formed on the second conductive semiconductor layer 1153.

The first conductive electrode 1156 and first conductive semiconductor layer 1155 may be a p-type electrode and a p-type semiconductor layer, respectively, and the second conductive electrode 1152 and the second conductive semiconductor layer 1153 may be an n-type electrode and an n-type semiconductor layer, respectively. However, the embodiment of the invention may not be necessarily limited to this, and may also have an illustration in which the first conductive type is an n-type and the second conductive type is a p-type.

More specifically, the first conductive electrode 1156 is formed on one surface of the first conductive semiconductor layer 1155, and the active layer 1154 is formed between the other surface of the first conductive semiconductor layer 1155 and one surface of the second conductive semiconductor layer 1153, and the second conductive electrode 1152 is formed on one surface of the second conductive semiconductor layer 1153.

In this instance, the second conductive electrode 1152 may be formed on one surface of the second conductive semiconductor layer 1153, and an undoped semiconductor layer 1153a may be formed on another surface of the second conductive semiconductor layer 1153.

Referring to FIG. 12 together with FIGS. 10 to 11B, one surface of the second conductive semiconductor layer 1153 may be a surface closest to the wiring substrate, and another surface of the second conductive semiconductor layer 1153 may be a surface farthest from the wiring substrate.

The first conductive electrode 1156 and the second conductive electrode 1152 are formed to have a height difference therebetween, at positions spaced from each other along a width direction of the semiconductor light emitting device, in a direction perpendicular to the width direction (or in a thickness direction).

The second conductive electrode 1152 is formed at the second conductive semiconductor layer 1153, using the height difference. In this instance, the second conductive electrode 1152 is disposed close to the second electrode 1040 positioned on the semiconductor light emitting device. For instance, the second conductive electrode 1152 is formed such that at least part thereof protrudes from a side surface of the second conductive semiconductor layer 1153 (or a side surface of the undoped semiconductor layer 1153a) along the width direction. Since the second conductive electrode 1152 protrudes from the side surface of the second conductive semiconductor layer 1153, the second conductive electrode 1152 can be exposed to an upper side of the semiconductor light emitting device. Under such configuration, the second conductive electrode 1152 is disposed at a position overlapping the second electrode 1040 disposed on the conductive adhesive layer 1030.

More specifically, at least one of the semiconductor light emitting devices is provided with a protruding unit 1152a extending from the second conductive electrode 1152 and protruding from a side surface of at least one of the plurality of semiconductor light emitting devices. In this instance, the first conductive electrode 1156 and the second conductive electrode 1152 are disposed at positions spaced from each other along a protruding direction of the protruding unit 1152a. The first conductive electrode 1156 and the second conductive electrode 1152 are formed to have a height difference therebetween, in a direction perpendicular to the protruding direction.

The protruding unit 1152a extends to a side surface of the second conductive semiconductor layer 1153, from one surface of the second conductive semiconductor layer 1153. The protruding unit 1152a extends to an upper surface of the second conductive semiconductor layer 1153, more specifically, the undoped semiconductor layer 1153a. The protruding unit 1152a protrudes from a side surface of the undoped semiconductor layer 1153a, along the width direction. Thus, the protruding unit 1152a may be electrically connected to the second electrode 1040, at an opposite side to the first conductive electrode based on the second conductive semiconductor layer. As shown the protruding unit 1152a has a step shape The structure where the semiconductor light emitting device is provided with the protruding unit 1152a can adopt advantages of the aforementioned horizontal type semiconductor light emitting device and vertical type semiconductor light emitting device. Also, the structure may be applied to a structure where a plug type electrode is formed at an N-GaN region (i.e., an N doped GaN region) of an isolated device and an outer region of the isolated device. In such a structure, current flows in a horizontal direction, but P and N wires for applying current to a panel are disposed on an opposite surface to the isolated device. Further, there are an advantage that an N electrode for N ohmic is formed on a Ga-Polar surface which is thermally stable, an advantage that the N wire passing through a lower part of the device does not block a light emitting region (multiple quantum well—MQW) to have less optical loss, etc.

Micro grooves may be formed on an upper surface of the undoped semiconductor layer 1153a by a roughing process, the upper surface being a surface farthest from the first conductive electrode 1156. In a vertical type semiconductor light emitting device, there is a limitation in a thickness of GaN when performing a roughing process, because Un-GaN (i.e., an undoped GaN or an intrinsic GaN, or a region thereof) should be all removed. However, in the embodiment of the invention, restrictions on a thickness of GaN are less, because part of Un-GaN can be used as a roughing process is performed through Un-GaN and N-GaN.

An upper surface of the protruding unit 1152a, which is farthest from the first conductive electrode 1156, has a height different from the upper surface of the undoped semiconductor layer 1153a, which is farthest from the first conductive electrode 1156. The height difference may be implemented for arrangement of a protection unit 1102 configured to absorb laser beams while the display device is fabricated.

The protection unit 1102 may serve to protect the second conductive electrode 1152, from laser beams used to separate a substrate (or a sapphire substrate) and an electrode from each other during a laser lift off (LLO) process. Processes of fabricating a display device using such protection unit 1102 will be explained later.

As shown, the protection unit 1102 is formed to cover at least part of the protruding unit 1152a, for protection of the protruding unit 1152a. The protection unit 1102 is formed of a conductive material that is electrically connected to the protruding unit 1152a, and the second electrode 1040 is electrically connected to the protection unit 1102.

For instance, the protection unit 1102 is provided with an upper surface farthest from the first conductive electrode 1156, and a lower surface closest to the first conductive electrode 1156. The second electrode 1040 is electrically connected to the upper surface, and the protruding unit 1152a is disposed on the lower surface. Thus, the protection unit 1102 directly contacts the second electrode 1040, at an opposite side to the first conductive electrode 1156 based on the second conductive semiconductor layer 1153, thereby electrically connecting the second conductive electrode 1152 to the second electrode 1040. Under such configuration, the second conductive electrode 1152 may be electrically connected to the second electrode 1040 by the protection unit 1102, at a position overlapping the second electrode 1040 disposed on the conductive adhesive layer 1030.

In this instance, the protection unit 1102 is formed of a material for absorbing laser beams, so as to protect the protruding unit 1152a. For instance, the protection unit 1102 may be formed of Indium Tin Oxide (ITO). Alternatively, the protection unit 1102 may be formed of a material having a specific resistance equal to or less than 10-3 Ωcm, and having a band gap smaller than that of laser beams during a laser lift off (LLO) process, such as ZnO, $SnO_2$, Al-doped ZnO (AZO), Titanium Dioxide ($TiO_2$) and Ga-doped ZnO (GZO).

Part of the protection unit 1120, which faces the protruding unit 1152a, is formed to completely cover part of the protruding unit 1152a facing the protection unit 1102. That is, the part of the protection unit 1120 facing the protruding unit 1152a, may be formed to have a larger area than the part of the protruding unit 1152a facing the protection unit 1102. This can allow the protruding unit 1152a not to be exposed to laser beams during fabrication processes of a display device. The protection unit 1102 may have a thickness great enough to sufficiently absorb laser beams for protection of a metallic electrode from the laser beams, e.g., a thickness equal to or more than 100 nm.

As shown, the protection unit 1102 extends from one surface of the second conductive semiconductor layer 1153, toward a side surface of the second conductive semiconductor layer 1153. Also, the protection unit 1102 extends up to a side surface of the undoped semiconductor layer 1153a, and protrudes from the side surface of the undoped semiconductor layer 1153a in a width direction of the semiconductor light emitting device. In this instance, the second conductive electrode 1152 extends from one surface of the second conductive semiconductor layer 1153 toward the protection unit 1102, such that at least a portion thereof overlaps the protection unit 1102. As shown, the protection unit 1102 has a step form, but such is not required. Also, the protection unit 1102 is interposed between the protruding unit 1152a and the second conductive semiconductor layer 1153.

The upper surface of the protection unit 1102 farthest from the first conductive electrode 1156, may be formed on the same plane as an upper surface of the undoped semiconductor layer 1153a farthest from the first conductive electrode 1156. However, the embodiment of the invention is not limited to this. That is, the embodiment of the invention may be also applicable to a structure not having the undoped semiconductor layer 1153a. In this instance, an upper surface of the undoped semiconductor layer 1153a is replaced by another surface of the second conductive semiconductor layer 1153.

Since the protection unit 1102 is arranged to cover one surface of a substrate (or a sapphire substrate) during fabrication processes of a display device, the protection unit can be separated from the substrate by laser beams. This can implement a structure where the protection unit and the substrate are separated from each other by laser beams for removing the substrate, without damage of the protruding unit.

During a laser lift-off (LLO) process for removing a substrate (or a sapphire substrate), when laser beams are emitted from a laser having a wavelength of ultraviolet rays, energy (about 4.6 eV) of the laser beams transmits a sapphire region having a large band gap (8.8 eV), while the energy (about 4.6 eV) of the laser beams is absorbed at a GaN region having a small band gap (about 3.3 eV). As an interface between the sapphire substrate and the GaN layer is heated to be decomposed by the absorbed energy of the laser beams, the sapphire substrate and the GaN layer are separated from each other. In a plug type semiconductor light emitting device, a metallic material rather than sapphire and GaN exists on the interface, and thus laser beams are absorbed at a metallic thin film layer. This may cause a metallic electrode to be melted.

In the embodiment of the invention, the protection unit serves to protect an electrode. The protection unit may be configured as an electrode protection thin film layer. For instance, if the protection unit is formed of Indium Tin Oxide (ITO), the protection unit can protect a metallic electrode from laser beams by absorbing the laser beams, due to its band gap of about 4 eV. The ITO has a transmission rate of 98~99% or more at a wavelength of 400 nm, thereby having no optical loss. Further, the ITO can allow current to smoothly flow to the second conductive electrode and the second electrode, due to its conductivity.

In the embodiment of the invention, a plurality of semiconductor light emitting devices 1050 may be formed to share a single second conductive electrode 1152, in sub pixels. Referring to FIG. 11B, a blue semiconductor light emitting device 1051a on which a red phosphor layer 1081 is deposited, a blue semiconductor light emitting device 1051b on which a green phosphor layer 1082 is deposited, and a blue semiconductor light emitting device 1051c on which no phosphor layer is deposited are sequentially arranged, along an arrangement direction of the second electrode 1040. In this instance, the second conductive electrode 1152 corresponding to the blue semiconductor light emitting devices 1051a, 1051b and 1051c in sub pixels are electrically connected to each other. That is, the single second conductive electrode 1152 is implemented as neighboring semiconductor light emitting devices in sub pixels are connected to each other. For instance, the single second conductive electrode 1152 is formed as a single bar in sub pixels.

Referring to FIG. 10, the single second conductive electrode 1152 is provided at each sub pixel, and is exposed to a side surface of N-GaN of the semiconductor light emitting devices when a substrate (or a sapphire substrate) is separated from the semiconductor light emitting devices during fabrication processes. This can allow a printed electrode to be directly deposited on the second conductive electrode 1152, without an etching process, or a vacuum process for ohmic contact. Such printed electrode may serve as the second electrode 1040.

According to the aforementioned flip chip type semiconductor light emitting device of a new structure, a flexible display device having a fine pitch and simple fabrication processes can be implemented.

So far, an instance where a display device includes a blue semiconductor light emitting device that emits blue (B) light has been explained. However, the embodiment of the invention is not limited to this. That is, other structure for implementing of sub-pixels of blue, red and green colors may be applied to the embodiment of the invention.

Figure 13A:
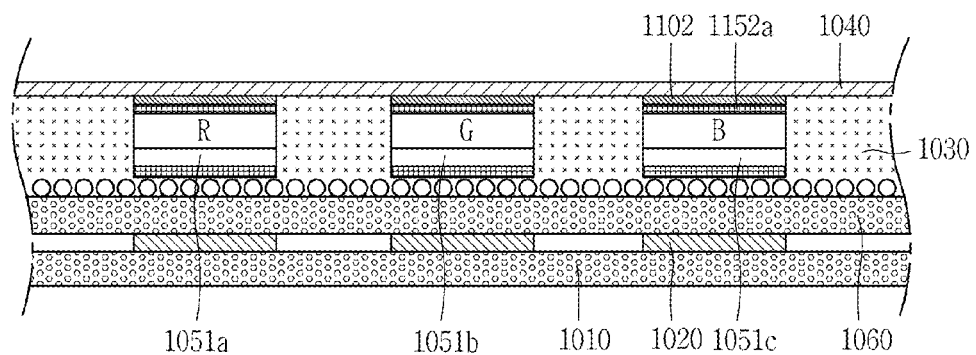
FIGS. 13A through 13C are conceptual views illustrating various forms for implementing colors in connection with a flip chip type semiconductor light emitting device with a new structure.
Figure 13B:
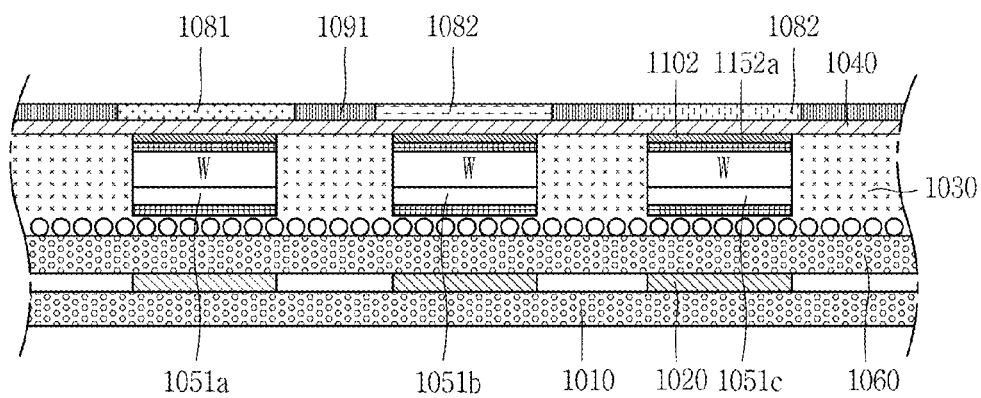
Figure 13C:
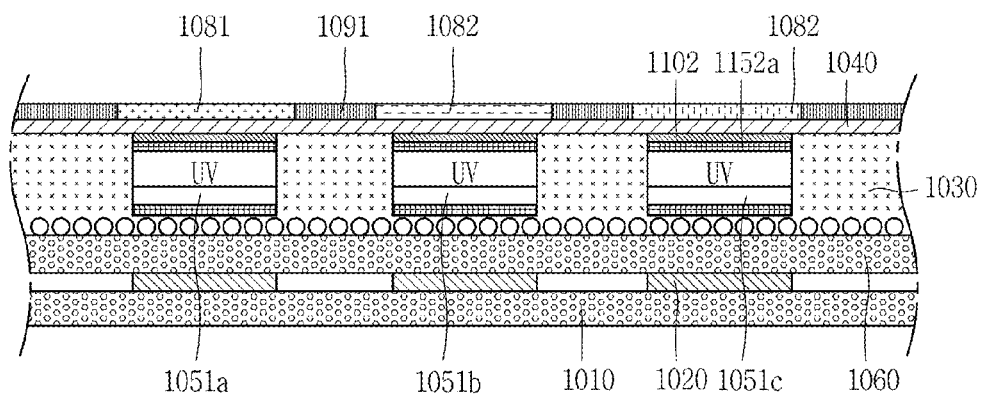

FIGS. 13A through 13C are conceptual views illustrating various forms for implementing colors in connection with a flip chip type semiconductor light emitting device with a new structure.

Referring to FIG. 13A, each semiconductor light emitting device 1050 may be implemented as a light emitting device of high output which can emit various light including blue light, by using GaN as a main component, and by using In and/or Al as added components.

In this instance, the semiconductor light emitting devices 1050 may be red, green and blue (RGB) semiconductor light emitting devices for implementing sub pixels. For instance, a red (R) semiconductor light emitting device, a green (G) semiconductor light emitting device, and a blue (B) semiconductor light emitting device are alternately arranged, and sub pixels of red (R), green (G) and blue (B) implement one pixel by the RGB semiconductor light emitting devices. Under such a configuration, a full color display can be implemented.

Under such structure, as aforementioned, the semiconductor light emitting devices may be provided with a first conductive electrode 1156 and a second conductive electrode 1152 having a height difference therebetween. The second conductive electrodes 1152 corresponding to the RGB semiconductor light emitting devices are electrically connected to each other. Each of the red (R) semiconductor light emitting device, the green (G) semiconductor light emitting device, and the blue (B) semiconductor light emitting device may be a semiconductor light emitting device of a new structure aforementioned with reference to FIGS. 10, 11A and 11B. Explanations about such structure will be referred back to the aforementioned explanations.

Such semiconductor light emitting devices may have an array structure to form a plurality of columns. In this instance, semiconductor light emitting devices which emit light of the same color may be arranged in the same column. For instance, semiconductor light emitting devices are arranged in a plurality of columns along lines of the plurality of first electrodes 1020, and semiconductor light emitting devices which emit light of the same color may be arranged in each column.

When semiconductor light emitting devices implement R, G and B colors independently, additional phosphor layers may not be provided. In this instance, the display device may further include black matrices 1091 disposed among a plurality of columns composed of semiconductor light emitting devices, for an enhanced contrast and reflection of external light. As shown, the black matrices 1091 may be arranged so as to be spaced from each other in a horizontal direction.

As another example, referring to FIG. 13B, each semiconductor light emitting device may be provided with a white (W) light emitting device having a yellow phosphor layer. In this instance, a phosphor layer may be formed on an upper surface of the white light emitting device (W). For sub pixels, a red phosphor layer 1081, a green phosphor layer 1082 and a blue phosphor layer 1083 may be provided on the white (W) light emitting devices.

Further, sub pixels may be implemented by color filters where red, green and blue colors are repeated on the white (W) light emitting devices. In this structure, as aforementioned, the white (W) light emitting devices may be provided with a first conductive electrode 1156 and a second conductive electrode 1152 having a height difference therebetween. The white (W) semiconductor light emitting devices may be semiconductor light emitting devices of a new structure aforementioned with reference to FIGS. 10, 11A and 11B. Explanations about such structure will be referred back to the aforementioned explanations.

In this instance, a display unit 1000*a* may further include black matrices 1091 disposed among a plurality of columns composed of semiconductor light emitting devices, for an enhanced contrast and reflection of external light. As shown, the black matrices 1091 may be arranged among the red phosphor layer 1081, the green phosphor layer 1082 and the blue phosphor layer 1083.

As another example, referring to FIG. 13C, a red phosphor layer 1081, a green phosphor layer 1082 and a blue phosphor layer 1083 may be provided on ultraviolet rays (UV) light emitting devices. The semiconductor light emitting device can use not only visible rays, but also ultraviolet rays (UV) in all regions thereof. The semiconductor light emitting device may be also implemented as a semiconductor light emitting device where ultraviolet rays (UV) can be used as an excitation source of the phosphor layers.

In this embodiment of the invention, the semiconductor light emitting devices 1050 are positioned on the conductive adhesive layer 1030 to configure sub pixels in the display device. The semiconductor light emitting devices 1050 may have an excellent luminance characteristic, and thus it may be possible to configure individual sub pixels even with a small size thereof. The size of the individual semiconductor light emitting device 1050 may be 80 μm or less in length of one side thereof, and formed with a rectangular or square shaped element. In the instance of a rectangular shaped element, the size thereof may be 20×80 μm or less.

In this structure, as aforementioned, the ultraviolet rays (UV) light emitting devices may be provided with a first conductive electrode 1156 and a second conductive electrode 1152 having a height difference therebetween. The ultraviolet rays (UV) semiconductor light emitting devices may be semiconductor light emitting devices of a new structure aforementioned with reference to FIGS. 10, 11A and 11B. Explanations about such structure will be referred back to the aforementioned explanations.

Furthermore, even when a square shaped semiconductor light emitting device 1050 with a length of one side of 10 μm is used for a sub pixel, it will exhibit a sufficient brightness for implementing a display device. Accordingly, for example, in the instance of a rectangular sub pixel in which one side thereof is 600 μm in size and the other side thereof is 300 μm, a relative distance between the semiconductor light emitting devices becomes sufficiently large. Accordingly, in this case, it may be possible to implement a flexible display device having an HD image quality.

In this instance, the display device may further include black matrices 1091 disposed among a plurality of columns composed of semiconductor light emitting devices, for an enhanced contrast and reflection of external light. As shown, the black matrices 1091 may be arranged among the red phosphor layer 1081, the green phosphor layer 1082 and the blue phosphor layer 1083.

The aforementioned display device using semiconductor light emitting devices may be fabricated by a new method. Hereinafter, such new fabrication method will be explained with reference to FIGS. 14A and 14B.

Figure 14A:
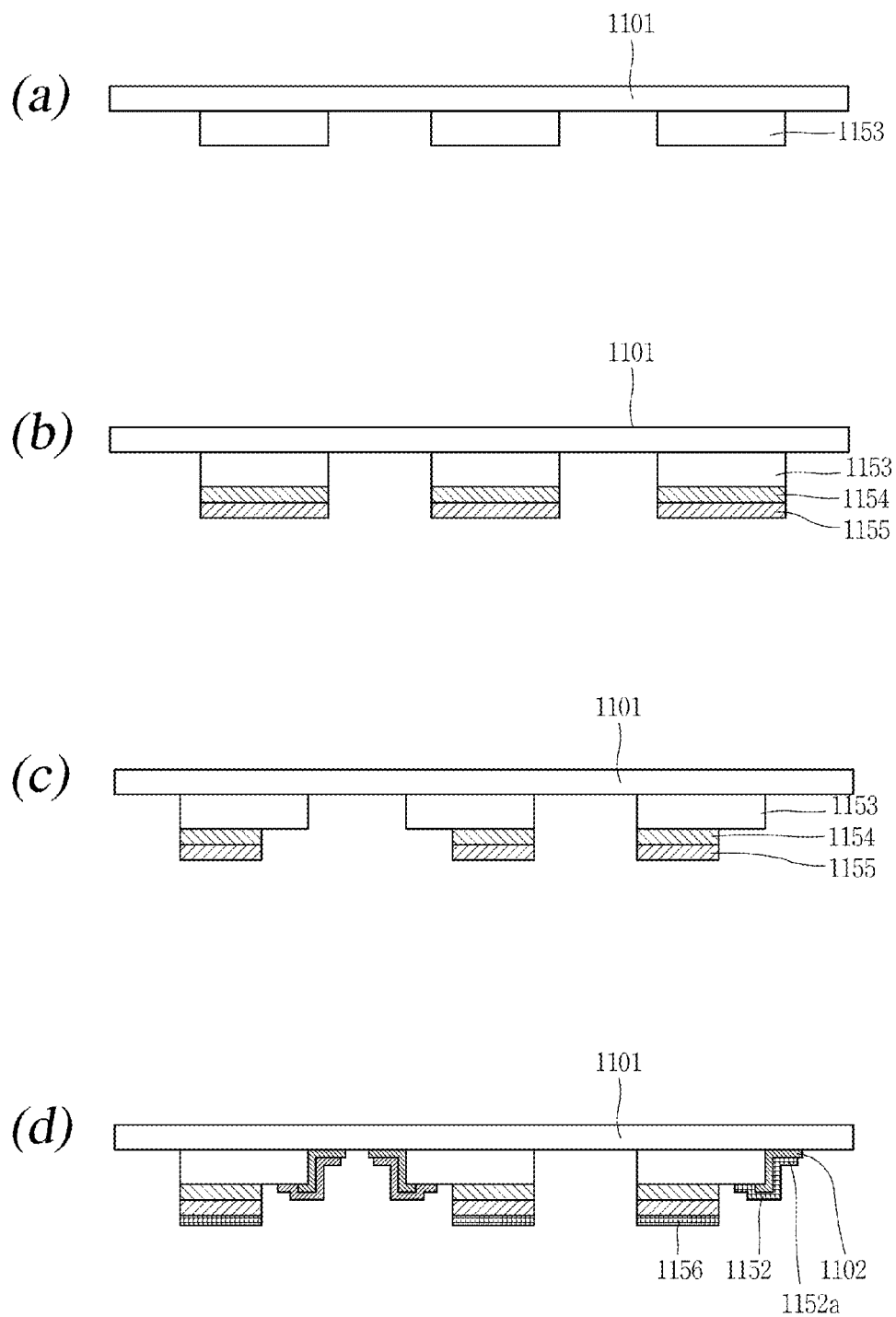
FIGS. 14A and 14B are cross-sectional views illustrating a method of fabricating a display device using a flip chip type semiconductor light emitting device with a new structure according to the embodiment of the invention.
Figure 14B:
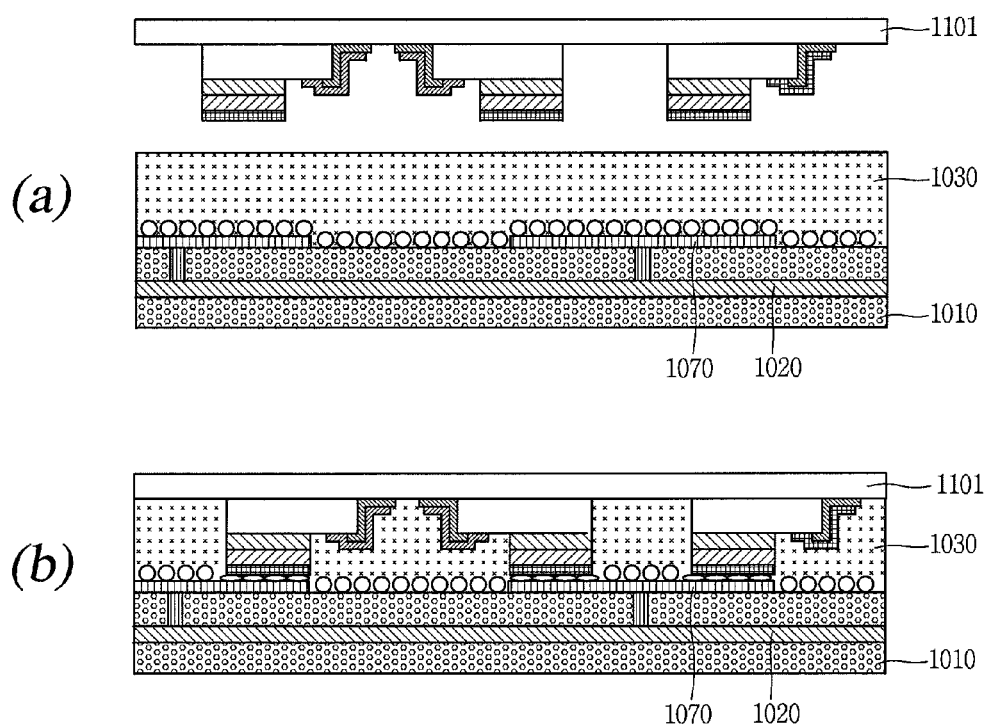
Figure 14B:
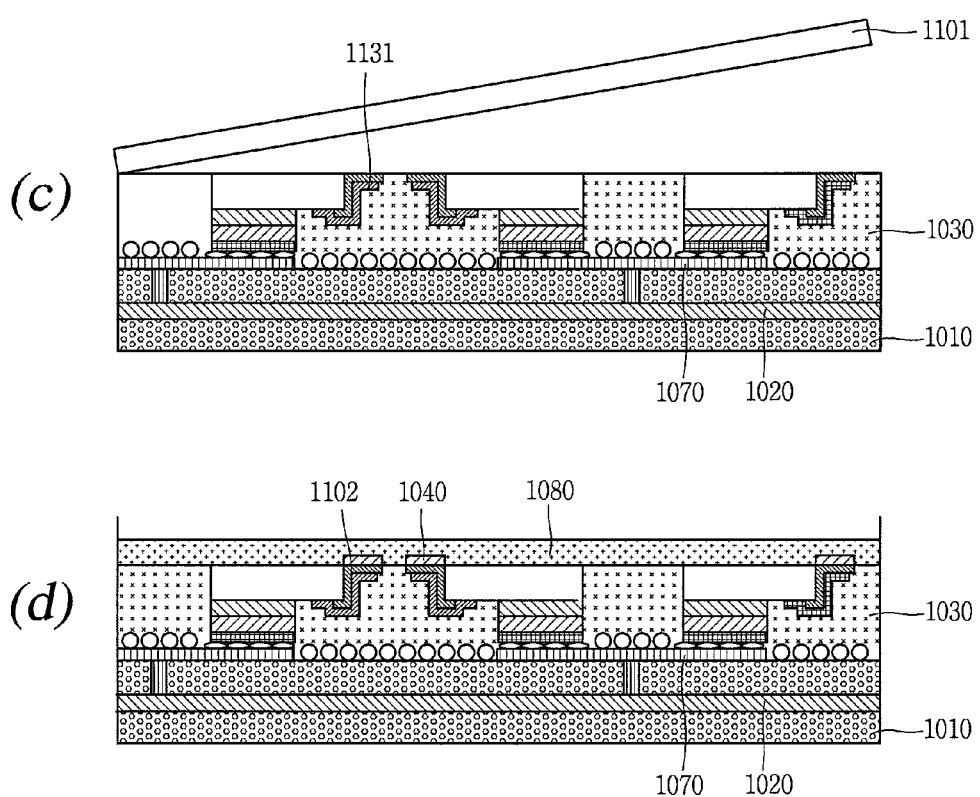
Figure 15A:
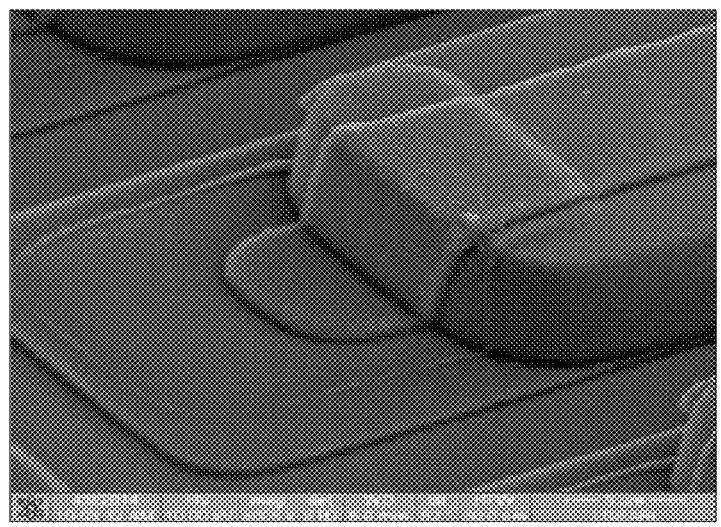
FIGS. 15A and 15B are views illustrating a Scanning Electron Microscope (SEM) image of a display device fabricated by the methods of FIGS. 14A and 14B.
Figure 15B:
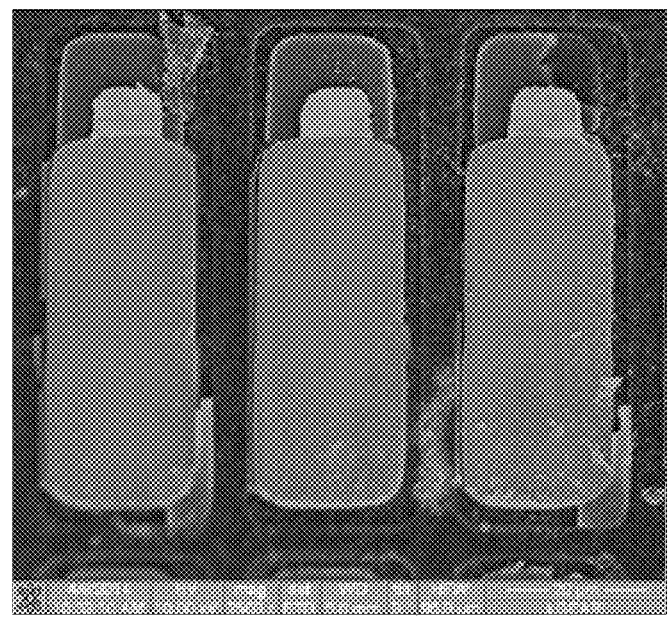
Figure 16:
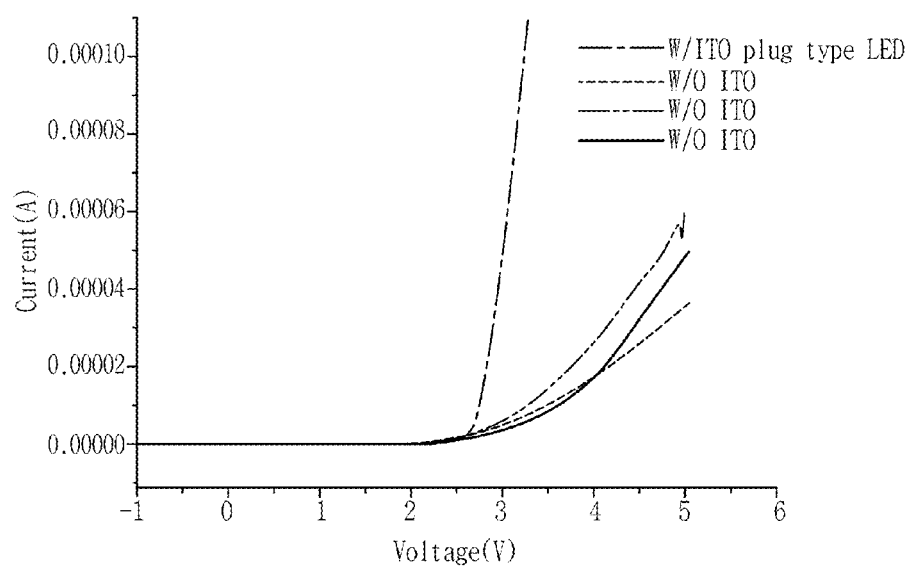
FIG. 16 is a graph illustrating electrical and optical characteristics of a display device fabricated by the methods of FIGS. 14A and 14B.

FIGS. 14A and 14B are cross-sectional views illustrating a method of fabricating a display device using a flip chip type semiconductor light emitting device with a new structure according to the embodiment of the invention. FIGS. 15A and 15B are views illustrating a SEM image of a display device fabricated by the methods of FIGS. 14A and 14B. FIG. 16 is a graph illustrating electrical and optical characteristics of a display device fabricated by the methods of FIGS. 14A and 14B.

First of all, a second conductive semiconductor layer 1153 is grown on a growing substrate (refer to (a) of FIG. 14A). In this instance, an undoped semiconductor layer 1153a (refer to FIG. 12) may be grown on the growing substrate, before the second conductive semiconductor layer 1153 is grown.

The growing substrate 1101 (wafer) may be formed to include an optical transmissive material, e.g., one of sapphire ($Al_2O_3$), GaN, ZnO and AlO. However, the embodiment of the invention is not limited to this. Alternatively, the growing substrate 1101 may be formed as a carrier wafer formed of a material proper to grow a semiconductor material. The growing substrate 1101 may be formed of a material having an excellent thermal conductivity, and may include a conductive substrate or an insulating substrate. For instance, an SiC substrate having a larger thermal conductivity than a sapphire ($Al_2O_3$) substrate, or at least one of Si, GaAs, GaP, InP and $Ga_2O_3$ may be used as the growing substrate 1101.

Once the second conductive semiconductor layer 1153 is grown, an active layer 1154 is grown, and a first conductive semiconductor layer 1155 is grown on the active layer 1154 (refer to (b) of FIG. 14A). Then, at least a part of the first conductive semiconductor layer 1155 and the active layer 1154 is removed so that at least a part of the second conductive semiconductor layer 1153 can be exposed to the outside (refer to (c) of FIG. 14A).

In this instance, the first conductive semiconductor layer 1155 and the active layer 1154 are partially removed in a vertical direction, so that the second conductive semiconductor layer 1153 is exposed to the outside.

Then, a protection unit 1102 is formed at the exposed part of the second conductive semiconductor layer 1153.

In this instance, the protection unit 1102 may serve as a unit for protecting a second conductive electrode 1152, from laser beams used to separate a substrate (sapphire substrate) from an electrode, during a laser lift-off (LLO) process. Explanations about a shape and a material of the protection unit 1102 will be referred back to the explanations aforementioned with reference to FIGS. 10 to 12.

Next, for implementation of a flip chip type semiconductor light emitting device, a first conductive electrode 1156 is formed on the first conductive semiconductor layer 1155, and the second conductive electrode 1152 is formed at the exposed part of the second conductive semiconductor layer 1153. In this instance, the second conductive electrode 1152 is formed at the protection unit 1102 (refer to (d) FIG. 14A). The first conductive electrode 1156 and the second conductive electrode 1152 may be formed by a deposition method such as a sputtering process. However, the embodiment of the invention is not limited to this.

The second conductive electrode 1152 is provided with a protruding unit 1152a. Explanations about a shape and a material of the protruding unit 1152a and the protection unit 1102 will be referred back to the explanations aforementioned with reference to FIGS. 10 to 12.

Next, the flip chip type semiconductor light emitting device is coupled to a conductive adhesive layer 1030 (refer to (b) of FIG. 14B).

For instance, a set of light emitting devices and a growing substrate is aligned with a wire electrode disposed below the conductive adhesive layer 1030 (refer to (a) of FIG. 14B), and heat or a catalyst is applied to the conductive adhesive layer 1030 while pressure is applied to the conductive adhesive layer 1030.

The conductive adhesive layer 1030 has a mobility by the heat, and the light emitting devices are buried in the conductive adhesive layer 1030. The first conductive electrode 1156 is electrically connected to a first electrode 1020 by conductive balls in the conductive adhesive layer 1030. Then, the conductive adhesive layer 1030 is hardened while the heat is discharged to the outside.

Once the conductive adhesive layer 1030 is hardened, the flip chip type semiconductor light emitting device and the growing substrate 1101 are separated from each other by laser beams (refer to (c) of FIG. 14B). The growing substrate 1101 may be removed by a laser lift off (LLO) process. In this instance, the protection unit 1102 is formed to cover the protruding unit 1152a, thereby protecting the protruding unit 1152a formed of a metallic material, from the laser beams.

FIG. 15A is a Scanning Electron Microscope (SEM) image of a semiconductor light emitting device, which illustrates an ITO is disposed below a metallic electrode. FIG. 15B is a SEM image of a semiconductor light emitting device of FIG. 15A, after an LLO process. Referring to FIG. 15B, a metallic electrode maintains the same shape before and after an LLO process, because an ITO serves as a layer for absorbing laser beams.

Referring to FIG. 16, when compared with a plug type semiconductor light emitting device having no ITO, an ITO-inserted plug type semiconductor light emitting device emits light normally, and has a normal current-voltage curve. Further, in the aspect of current leakage, an IR characteristic is normal at a voltage of −5V, with a current of several nA.

Finally, a second electrode 1040 is printed (deposited) on an upper surface of the conductive adhesive layer 1030, so as to cover the second conductive electrode 1152 (refer to (d) of FIG. 14B(d)). As aforementioned, the protruding unit is exposed to a side surface of N-GaN (or U-GaN) of a semiconductor light emitting device when the substrate (or sapphire substrate) is separated from the electrode during fabrication processes. This can allow a printed electrode to be directly deposited on the second conductive electrode, without an etching process, or a vacuum process for ohmic contact.

As the invention may be embodied in several forms without departing from the characteristics thereof, it should also be understood that the above-described embodiments are not limited by any of the details of the foregoing description, unless otherwise specified, but rather should be construed broadly within its scope as defined in the appended claims, and therefore all changes and modifications that fall within the metes and bounds of the claims, or equivalents of such metes and bounds are therefore intended to be embraced by the appended claims.

What is claimed is:
1. A display device, comprising:
a first electrode;
a second electrode; and
a plurality of semiconductor light emitting devices coupled to a conductive adhesive layer, and electrically connected to the first electrode and the second electrode, wherein at least one of the plurality of semiconductor light emitting devices includes:
a first conductive electrode and a second conductive electrode spaced from each other;
a protruding unit extending from the second conductive electrode, and protruding from a side surface of at least one of the plurality of semiconductor light emitting devices; and
a protection unit configured to cover at least part of the protruding unit for protection of the protruding unit, and
wherein the protection unit is formed of a conductive material that is electrically connected to the protruding unit.

2. The display device of claim 1, wherein the first electrode is electrically connected to the first conductive electrode, and the second electrode is electrically connected to the protection unit.

3. The display device of claim 2, wherein the protection unit is provided with an upper surface farthest from the first conductive electrode, and the second electrode is electrically connected to the upper surface.

4. The display device of claim 1, wherein part of the protection unit facing the protruding unit is formed to completely cover a part of the protruding unit facing the protection unit.

5. The display device of claim 1, wherein the protection unit is formed of a material capable of absorbing laser beams so as to protect the protruding unit from the laser beams.

6. The display device of claim 5, wherein the protection unit is formed of at least one of ZnO, $SnO_2$, Al-doped ZnO (AZO), Titanium Dioxide ($TiO_2$) and Ga-doped ZnO (GZO), and materials having a band gap smaller than that of the laser beams.

7. The display device of claim 1, wherein at least one of the plurality of semiconductor light emitting devices includes a first conductive semiconductor layer, a second conductive semiconductor layer, and an active layer which are laminated in order, and
wherein the protection unit extends from one surface to a side surface of the second conductive semiconductor layer.

8. The display device of claim 7, wherein the second conductive electrode is disposed on the one surface, and the second conductive electrode extends such that at least part thereof overlaps the protection unit.

9. The display device of claim 7, wherein an undoped semiconductor layer is formed on another surface of the second conductive semiconductor layer, and
wherein an upper surface of the protection unit, farthest from the first conductive electrode, is formed on the same plane as an upper surface of the undoped semiconductor layer farthest from the first conductive electrode.

10. The display device of claim 7, wherein the first electrode is disposed on a wiring substrate,
wherein at least part of the plurality of semiconductor light emitting devices is coupled to the conductive adhesive layer disposed between the wiring substrate and the second electrode, and
wherein the one surface of the second conductive semiconductor layer is a surface closest to the wiring substrate.

11. The display device of claim 1, wherein the first conductive electrode and the second conductive electrode are spaced from each other along a protruding direction of the protruding unit, and are formed to have a height difference therebetween in a direction perpendicular to the protruding direction.

12. The display device of claim 11, wherein the plurality of semiconductor light emitting devices are implemented as flip chip type semiconductor light emitting devices.

13. The display device of claim 1, wherein each of the plurality of semiconductor light emitting devices is configured to emit at least one of red light, green light, blue light and ultraviolet light.

14. The display device of claim 1, further comprising a phosphor configured to convert light emitted from at least one of the plurality of semiconductor light emitting devices, into at least one of red light, green light and blue light.

15. A method of fabricating a display device, comprising:
sequentially growing a first conductive semiconductor layer, an active layer, and a second conductive semiconductor layer, on a substrate;
removing at least part of the first conductive semiconductor layer and the active layer, such that at least a part of the second conductive semiconductor layer is exposed;
forming a first conductive electrode on the first conductive semiconductor layer, and forming a second conductive electrode at the exposed part of the second conductive semiconductor layer, for implementation of a flip chip type semiconductor light emitting device; and
separating the substrate and the flip chip type semiconductor light emitting device from each other using laser beams,
wherein the second conductive electrode is provided with a protruding unit protruding from a side surface of the flip chip type semiconductor light emitting device,
wherein a protection unit is formed to cover at least a part of the protruding unit, such that the protruding unit is protected from the laser beams, and
wherein in the forming of the second conductive electrode, the protection unit is formed at the exposed part of the second conductive semiconductor layer, and the second conductive electrode is formed at the protection unit.

16. The method of claim 15, wherein the protection unit is formed of a conductive material that is electrically connected to the protruding unit.

17. A flip chip type semiconductor light emitting device, comprising:
a first conductive semiconductor layer;
a second conductive semiconductor layer; and
an active layer,
wherein a first conductive electrode is formed on one surface of the first conductive semiconductor layer, the active layer is formed between another surface of the first conductive semiconductor layer and one surface of the second conductive semiconductor layer, and a second conductive electrode is formed at the second conductive semiconductor layer,
wherein the second conductive electrode is provided with a protruding unit protruding from a side surface of the second conductive semiconductor layer, and
wherein a protection unit formed of a conductive material is formed to cover the protruding unit.

18. The flip chip type semiconductor light emitting device of claim 17, wherein a part of the protection unit facing the protruding unit has a larger area than a part of the protruding unit facing the protection unit.

* * * * *